United States Patent
Ishikawa et al.

(10) Patent No.: US 12,338,543 B2
(45) Date of Patent: Jun. 24, 2025

(54) VAPOR PHASE GROWTH METHOD USING REFLECTOR WITH CHANGEABLE PATTERN

(71) Applicant: NuFlare Technology, Inc., Kanagawa (JP)

(72) Inventors: Yoshitaka Ishikawa, Yokohama (JP); Takehiko Kobayashi, Shizuoka (JP); Hideshi Takahashi, Yokohama (JP); Yasushi Iyechika, Chiba (JP); Takashi Haraguchi, Fujisawa (JP); Kiyotaka Miyano, Tokyo (JP)

(73) Assignee: NuFlare Technology, Inc., Kanagawa (JP)

( * ) Notice: Subject to any disclaimer, the term of this patent is extended or adjusted under 35 U.S.C. 154(b) by 1590 days.

(21) Appl. No.: 16/715,789

(22) Filed: Dec. 16, 2019

(65) Prior Publication Data

US 2020/0115822 A1 Apr. 16, 2020

Related U.S. Application Data

(62) Division of application No. 15/694,306, filed on Sep. 1, 2017, now abandoned.

(30) Foreign Application Priority Data

Sep. 5, 2016 (JP) .................................. 2016-172860
May 30, 2017 (JP) .................................. 2017-106795

(51) Int. Cl.
*C30B 25/04* (2006.01)
*C23C 16/06* (2006.01)
(Continued)

(52) U.S. Cl.
CPC .............. *C30B 25/04* (2013.01); *C23C 16/06* (2013.01); *C23C 16/18* (2013.01); *C23C 16/34* (2013.01);
(Continued)

(58) Field of Classification Search
CPC ......... C23C 16/06; C23C 16/18; C23C 16/34; C23C 16/4584; C23C 16/4586;
(Continued)

(56) References Cited

U.S. PATENT DOCUMENTS 6,933,531 B1    8/2005  Ishikawa et al.
2007/0204796 A1*  9/2007  Hirata ................. C23C 16/4585
                                                    118/715
(Continued)

FOREIGN PATENT DOCUMENTS

JP      4-358068 A      12/1992
JP      2001-339022 A   12/2001
(Continued)

OTHER PUBLICATIONS

Japanese Office Action (JPOA) dated Mar. 23, 2021 issued in the corresponding Japanese Patent Application No. 2017-106795 and its English machine translation.

*Primary Examiner* — Joshua Benitez Rosario
*Assistant Examiner* — Scott E Bauman
(74) *Attorney, Agent, or Firm* — RANKIN, HILL & CLARK LLP

(57) ABSTRACT

A vapor phase growth apparatus according to an embodiment includes a reaction chamber, a holder provided in the reaction chamber, the holder holding a substrate, a heater heating the substrate, a first reflector facing the holder, the heater being interposed between the first reflector and the holder, a second reflector provided between the first reflector and the heater, the second reflector having a compressive strength or a bending strength equal to or less than 1000 MPa or a Vickers hardness equal to or less than 8 GPa, the second reflector having a pattern, and a rotating shaft fixed to the holder, the rotating shaft rotating the holder.

2 Claims, 25 Drawing Sheets

(51) Int. Cl.
- *C23C 16/18* (2006.01)
- *C23C 16/34* (2006.01)
- *C23C 16/458* (2006.01)
- *C23C 16/46* (2006.01)
- *C23C 16/48* (2006.01)
- *C30B 25/10* (2006.01)
- *H10H 20/01* (2025.01)
- *H10H 20/812* (2025.01)

(52) U.S. Cl.
CPC ...... *C23C 16/4584* (2013.01); *C23C 16/4586* (2013.01); *C23C 16/46* (2013.01); *C23C 16/481* (2013.01); *C23C 16/482* (2013.01); *C30B 25/10* (2013.01); *H10H 20/01335* (2025.01); *H10H 20/812* (2025.01)

(58) Field of Classification Search
CPC ..... C23C 16/46; C23C 16/481; C23C 16/482; H01L 33/007; H01L 33/06; H10H 20/01335; H10H 20/812
See application file for complete search history.

(56) References Cited

U.S. PATENT DOCUMENTS

| | | | |
|---|---|---|---|
| 2012/0070577 A1* | 3/2012 | Deura | C23C 16/4584 118/58 |
| 2012/0244684 A1* | 9/2012 | Suzuki | H01L 21/0237 118/724 |
| 2015/0021163 A1* | 1/2015 | Lu | H10F 71/137 204/192.1 |

FOREIGN PATENT DOCUMENTS

| | | | |
|---|---|---|---|
| JP | 2010116606 A | * | 5/2010 |
| JP | 2013084943 A | * | 5/2013 |

* cited by examiner

60°
334

70°

INNER 0° / OUTER 0°

INNER 15° / OUTER 10°

INNER 45° / OUTER 10°

INNER 45° / OUTER 22.5°

VAPOR PHASE GROWTH METHOD USING REFLECTOR WITH CHANGEABLE PATTERN

CROSS-REFERENCE TO RELATED APPLICATION

This application is based upon and claims the benefit of priority from Japanese Patent Applications No. 2016-172860, filed on Sep. 5, 2016, and, Japanese Patent Applications No. 2017-106795, filed on May 30, 2017, the entire contents of which are incorporated herein by reference.

FIELD OF THE INVENTION

The present invention relates to a vapor phase growth apparatus and a vapor phase growth method that supply gas and form a film.

BACKGROUND OF THE INVENTION

As a method for forming a high-quality semiconductor film, there is an epitaxial growth technique which grows a single-crystal film on a substrate, such as a wafer, using vapor phase growth. In a vapor phase growth apparatus using the epitaxial growth technique, a wafer is placed on a holder in a reaction chamber which is maintained at atmospheric pressure or reduced pressure. Then, process gas, such as source gas which will be a raw material for forming a film, is supplied from an upper part of the reaction chamber to the surface of the wafer in the reaction chamber while the wafer is being heated. For example, the thermal reaction of the source gas occurs in the surface of the wafer and an epitaxial single-crystal film is formed on the surface of the wafer.

The characteristics of the epitaxial single-crystal film formed on the surface of the wafer, for example, the thickness, chemical composition, and crystallinity of the epitaxial single-crystal film depend on the temperature of the wafer during deposition. Therefore, the characteristics of the film vary depending on the temperature distribution of the wafer. For this reason, it is preferable to easily adjust the temperature distribution of the wafer to a desired temperature distribution. JP 2012-69689 discloses a vapor phase growth apparatus including a reflector in which holes with different diameters are provided in order to arbitrarily adjust the temperature distribution.

However, for example, when the temperature distribution of the wafer is adjusted by the shape of a heater or the shape of a reflector made of a material that is difficult to process, it takes a long time to perform the adjustment and productivity is reduced. For example, it takes a long time to change the design of a heater or a reflector and to manufacture a new heater or a new reflector.

SUMMARY OF THE INVENTION

According to an aspect of the invention, there is provided a vapor phase growth apparatus including: a reaction chamber; a holder provided in the reaction chamber, the holder holding a substrate; a heater heating the substrate; a first reflector facing the holder, the heater being interposed between the first reflector and the holder; a second reflector provided between the first reflector and the heater, the second reflector having a compressive strength or a bending strength equal to or less than 1000 MPa or a Vickers hardness equal to or less than 8 GPa, the second reflector having a pattern; and a rotating shaft fixed to the holder, the rotating shaft rotating the holder.

According to another aspect of the invention, a vapor phase growth apparatus including: a reaction chamber; a holder provided in the reaction chamber, the holder holding a substrate; a heater heating the substrate; a first reflector facing the holder, the heater being interposed between the first reflector and the holder; a second reflector provided between the first reflector and the heater, the second reflector including a first portion with a first sub-pattern and a second portion with a second sub-pattern, the first portion and the second portion being relatively rotatable; and a rotating shaft fixed to the holder, the rotating shaft rotating the holder.

According to still another aspect of the invention, there is provided a vapor phase growth method including: heating a first substrate using a heater and a first reflector, the heater being interposed between the first reflector and the first substrate; measuring a characteristic distribution of the first substrate under predetermined process conditions; providing a second reflector between the first reflector and the heater, the second reflector having a pattern based on the characteristic distribution, the second reflector having a compressive strength or a bending strength equal to or less than 1000 MPa or a Vickers hardness equal to or less than 8 GPa; heating a second substrate, using the heater, the first reflector, and the second reflector; and forming a film on the second substrate under the predetermined process conditions.

According to yet another aspect of the invention, there is provided a vapor phase growth method including: heating a first substrate, using a heater and a reflector with a first pattern, the heater being interposed between the reflector and the first substrate; measuring a characteristic distribution of the first substrate under predetermined process conditions; and forming a film on a second substrate under the predetermined process conditions, using the heater and the reflector changed to a second pattern different from the first pattern on the basis of the characteristic distribution.

DETAILED DESCRIPTION OF THE EMBODIMENTS

Figure 1:
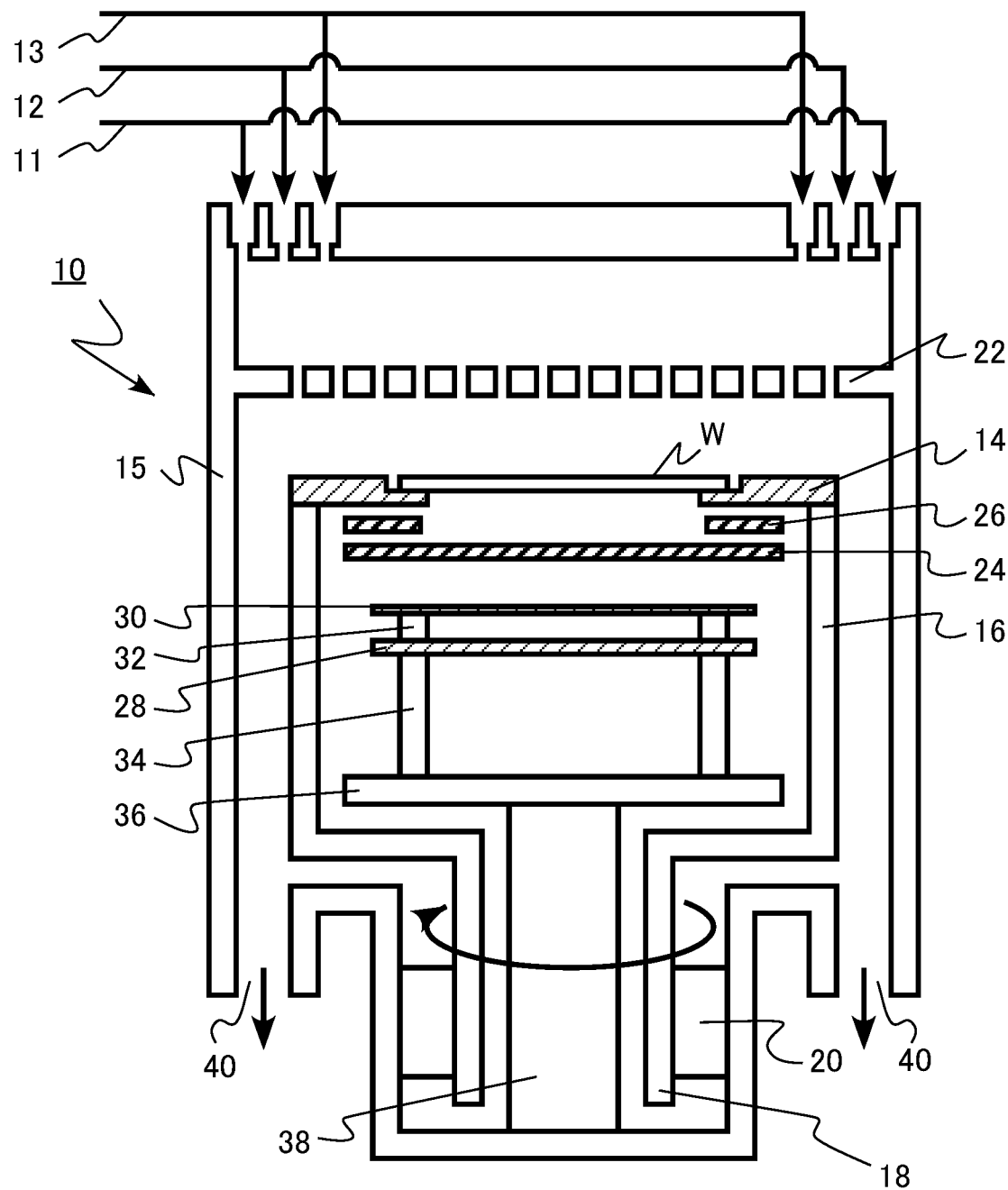
FIG. 1 is a cross-sectional view schematically illustrating a vapor phase growth apparatus according to a first embodiment.

Hereinafter, embodiments of the invention will be described with reference to the drawings.

In the specification, in some cases, the same or similar members are denoted by the same reference numerals.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference. Furthermore, a "longitudinal direction" is the direction of gravity.

In the specification, "process gas" is a general term of gas used to form a film on a substrate. The concept of the "process gas" includes, for example, source gas, carrier gas, and diluent gas.

First Embodiment

A vapor phase growth apparatus according to this embodiment includes: a reaction chamber; a holder which is provided in the reaction chamber and on which a substrate is placed; a heater that heats the substrate; a first reflector that is provided so as to face the holder with the heater interposed therebetween; a second reflector that is provided between the first reflector and the heater, has a compressive strength or a bending strength equal to or less than 1000 MPa or a Vickers hardness equal to or less than 8 GPa, and has a pattern; and a rotating shaft that is fixed to the holder and rotates the holder.

In addition, a vapor phase growth method according to this embodiment includes: heating a first substrate, using a heater and a first reflector that is opposite to the first substrate with the heater interposed therebetween; measuring a characteristic distribution of the first substrate under predetermined process conditions; providing a second reflector, which has a pattern based on the characteristic distribution and has a compressive strength or a bending strength equal to or less than 1000 MPa or a Vickers hardness equal to or less than 8 GPa, between the first reflector and the heater; heating a second substrate, using the heater, the first reflector, and the second reflector; and forming a film on the second substrate under the predetermined process conditions.

In the manufacturing method according to this embodiment, an example in which a "characteristic distribution" is a "temperature distribution" will be described.

The above-mentioned configuration of the vapor phase growth apparatus and the vapor phase growth method according to this embodiment makes it possible to easily adjust the temperature distribution of the substrate at a film forming process.

FIG. 1 is a cross-sectional view schematically illustrating the vapor phase growth apparatus according to this embodiment. The vapor phase growth apparatus according to this embodiment is, for example, an epitaxial growth apparatus that uses a metal organic chemical vapor deposition method (MOCVD method).

The vapor phase growth apparatus according to this embodiment includes a reaction chamber 10, a first gas supply path 11, a second gas supply path 12, and a third gas supply path 13. The reaction chamber 10 includes a ring-shaped holder 14, a rotating unit 16, a rotating shaft 18, a rotating mechanism 20, a shower plate 22, an in-heater 24, an out-heater 26, a standard reflector (first reflector) 28, an adjustment reflector (second reflector) 30, a support portion 32, a support column 34, a fixed table 36, a fixed shaft 38, and a gas outlet 40.

The first gas supply path 11, the second gas supply path 12, and the third gas supply path 13 supply process gas to the reaction chamber 10.

The first gas supply path 11 supplies, for example, a first process gas including organic metal, where the metal is a group-III element, and carrier gas to the reaction chamber 10. The first process gas is gas including a group-III element when a group III-V semiconductor film is formed on a wafer.

The group-III element is, for example, gallium (Ga), aluminum (Al), or indium (In). In addition, the organic metal is, for example, trimethylgallium (TMG), trimethlyaluminum (TMA), or trimethylindium (TMI).

The second gas supply path 12 supplies, for example, a second process gas including ammonia (NH₃) to the reaction chamber 10. The second process gas is a source gas of a group-V element or nitrogen (N) when a group III-V semiconductor film is formed on a wafer.

The third gas supply path 13 supplies, for example, a diluent gas which dilutes the first process gas and the second process gas to the reaction chamber 10. The first process gas and the second process gas are diluted with the diluent gas to adjust the concentration of the group-III element and the group-V element supplied to the reaction chamber 10. The diluent gas is inert gas, such as hydrogen gas, nitrogen gas, or argon gas, or a mixed gas thereof.

The reaction chamber 10 includes, for example, a stainless cylindrical wall surface 15. The shower plate 22 is provided in an upper part of the reaction chamber 10. A plurality of gas ejection holes are provided in the shower plate 22. The process gas is supplied from the plurality of gas ejection holes to the reaction chamber 10.

The ring-shaped holder 14 is provided in the reaction chamber 10. A wafer (substrate) W can be placed on the ring-shaped holder 14. An opening portion is provided at the center of the ring-shaped holder 14.

The ring-shaped holder 14 is fixed to an upper part of the rotating unit 16. The rotating unit 16 is fixed to the rotating shaft 18. The ring-shaped holder 14 is indirectly fixed to the rotating shaft 18.

The rotating shaft 18 can be rotated by the rotating mechanism 20. The rotating mechanism 20 can rotate the rotating shaft to rotate the ring-shaped holder 14. The ring-shaped holder 14 is rotated to rotate the wafer W placed on the ring-shaped holder 14.

For example, the wafer W is rotated at a speed that is equal to or greater than 50 rpm and equal to or less than 3000 rpm. The rotating mechanism 20 includes, for example, a motor and a bearing.

A heater that heats the wafer W from a lower surface (rear surface) side includes the in-heater 24 and the out-heater 26. The in-heater 24 and the out-heater 26 are provided below the ring-shaped holder 14. The in-heater 24 and the out-heater 26 are provided in the rotating unit 16. The out-heater 26 is provided between the in-heater 24 and the ring-shaped holder 14.

The in-heater 24 and the out-heater 26 heat the wafer W held by the ring-shaped holder 14 and the ring-shaped holder 14. The in-heater 24 mainly heats a central portion of the wafer W. The out-heater 26 mainly heats an outer circumferential portion of the wafer W and the ring-shaped holder 14. The in-heater 24 has, for example, a disk shape. The out-heater 26 has, for example, a ring shape.

The standard reflector 28 is provided below the in-heater 24 and the out-heater 26. The in-heater 24 and the out-heater 26 are provided between the standard reflector 28 and the ring-shaped holder 14.

The standard reflector 28 reflects heat that is radiated downward from the in-heater 24 and the out-heater 26 to improve the heating efficiency of the wafer W. In addition, the standard reflector 28 prevents members below the standard reflector 28 from being heated. The standard reflector 28 has, for example, a disk shape.

The standard reflector 28 is made of a material with high heat resistance. The standard reflector 28 has, for example, resistance to a heat temperature of 1100° C. or more.

The standard reflector 28 is fixed to the fixed table 36 by, for example, a plurality of support columns 34. The fixed table 36 is supported by, for example, the fixed shaft 38.

The standard reflector 28 is made of ceramics or metal. The standard reflector 28 can be made of ceramics, such as silicon carbide (SiC), graphite, pyrolytic graphite (PG), pyrolytic boron nitride (PBN), or tantalum carbide (TaC). In addition, high-melting-point metal, such as tungsten, molybdenum, or rhenium, can be used as metal. For example, a material obtained by coating a base material, such as graphite, with SiC, PBN, PG, or TaC can be used.

The adjustment reflector 30 is provided between the standard reflector 28 and the in-heater 24. The adjustment reflector 30 has a pattern. The pattern of the adjustment reflector 30 is adjusted to easily adjust the temperature distribution of the wafer W.

The adjustment reflector 30 is made of a material with high heat resistance. The adjustment reflector 30 has, for example, resistance to a heat temperature of 1100° C. or more.

The compressive strength or bending strength of the adjustment reflector 30 is equal to or less than 1000 MPa, or the Vickers hardness of the adjustment reflector 30 is equal to or less than 8 GPa. The adjustment reflector 30 is made of a material that has a compressive strength or a bending strength equal to or less than 1000 MPa or a material that has a Vickers hardness equal to or less than 8 GPa. At least one of the compressive strength, bending strength, and Vickers hardness of the adjustment reflector 30 is within the above-mentioned strength range. Since the strength of the adjustment reflector 30 is within the above-mentioned strength range, it is easy to process the adjustment reflector 30 in a desired pattern, using, for example, drilling and bending.

In order to satisfy the above-mentioned strength range, the adjustment reflector 30 can be made of, for example, graphite sheet, graphite, pyrolytic graphite (PG), a carbon fiber reinforced carbon composite (C/C composite), sintered boron nitride (hBN), or a mixture of sintered boron nitride (hBN) and silicon nitride. It s particularly preferable that the adjustment reflector 30 be made of a graphite sheet or graphite since the graphite sheet or graphite is easy to process and is inexpensive.

For example, at least one of the compressive strength, bending strength, and Vickers hardness of the adjustment reflector 30 is less than that of the standard reflector 28.

For example, when the standard reflector 28 is made of silicon carbide, the adjustment reflector 30 may be made of a graphite sheet.

For example, a plurality of support portions 32 are provided between the adjustment reflector 30 and the standard reflector 28. The standard reflector 28 and the adjustment reflector 30 are separated from each other by a predetermined distance, with the plurality of support portions 32 interposed therebetween.

Figure 2A:
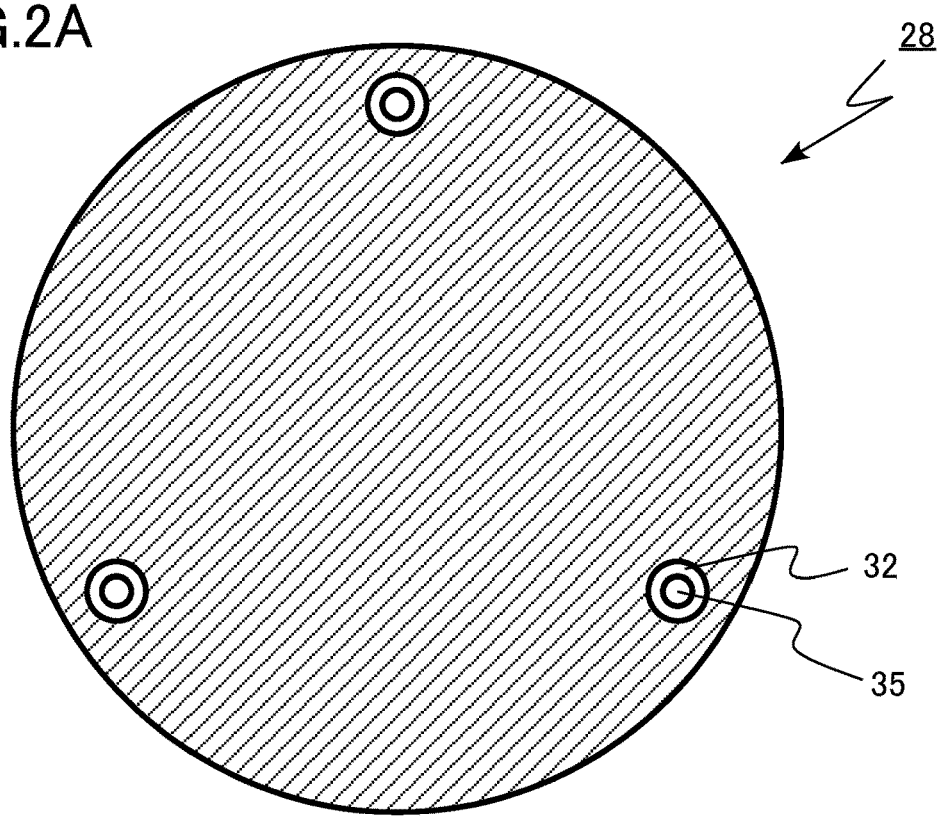
FIGS. 2A and 2B are plan views schematically illustrating an example of a reflector according to the first embodiment.
Figure 2B:
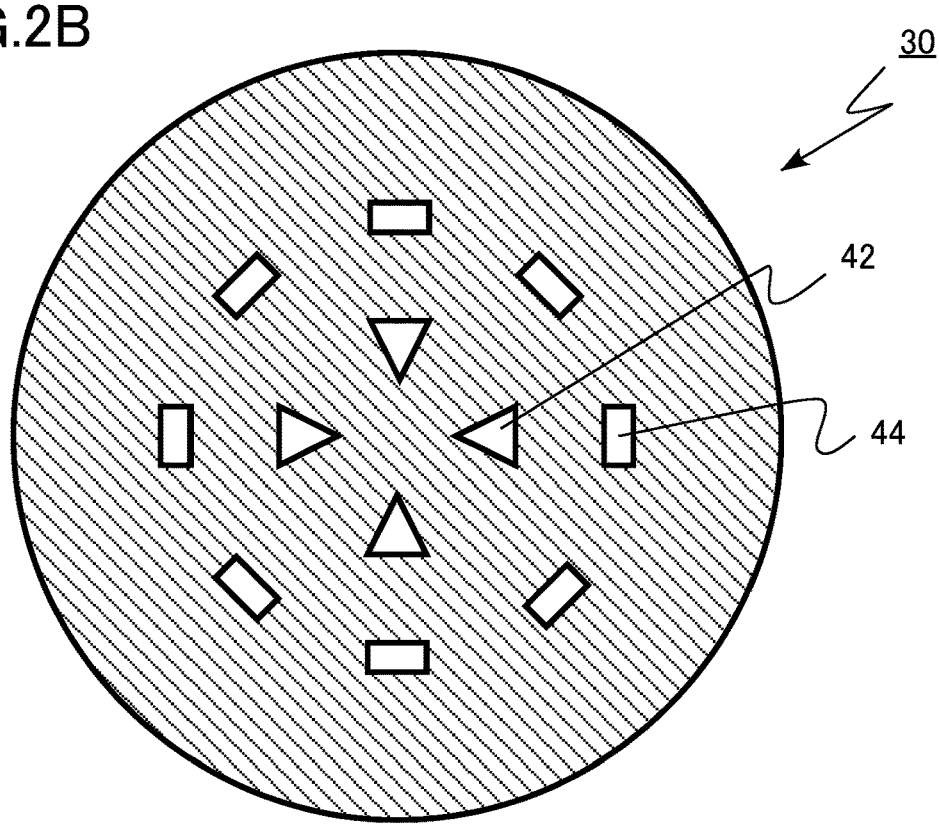

FIGS. 2A and 2B are plan views schematically illustrating an example of the reflector according to this embodiment. FIG. 2A illustrates the standard reflector 28 and FIG. 2B illustrates the adjustment reflector 30. FIGS. 2A and 2B are top views illustrating the reflectors.

As illustrated in FIG. 2A, the standard reflector 28 has, for example, a disk shape. For example, three support portions 32 are provided on the standard reflector 28.

As illustrated in FIG. 2B, the adjustment reflector 30 has, for example, a disk shape. The adjustment reflector 30 has, for example, a plurality of inner-circumferential-side opening portions (opening portions) 42 and a plurality of outer-circumferential-side opening portions (opening portions) 44.

The pattern of the adjustment reflector 30 is formed by the plurality of inner-circumferential-side opening portions 42 and the plurality of outer-circumferential-side opening portions 44.

For example, the pattern of the adjustment reflector 30 is rotationally symmetric. The pattern of the adjustment reflector 30 illustrated in FIG. 2B has fourfold symmetry.

Figure 3A:
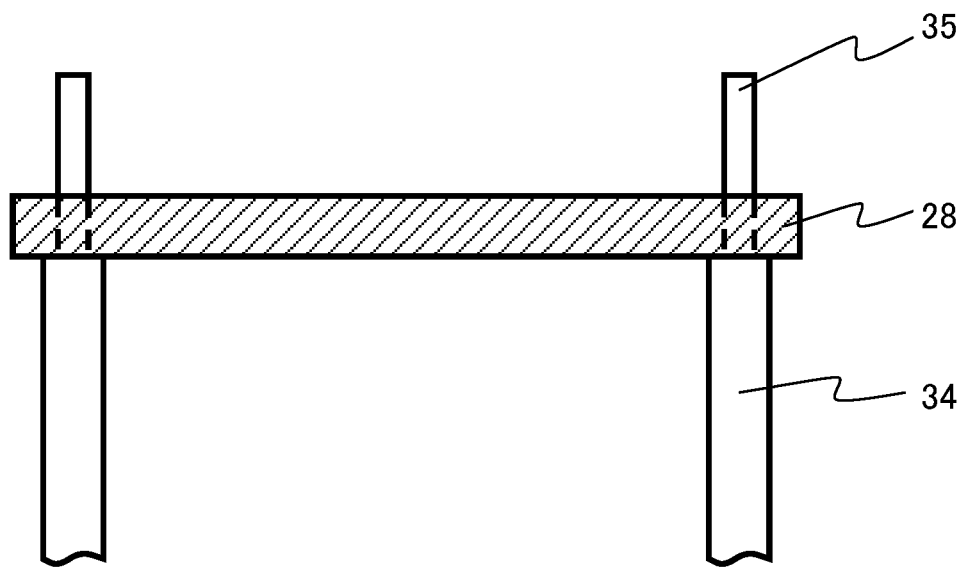
FIGS. 3A and 3B are cross-sectional views schematically illustrating an example of the reflector according to the first embodiment.
Figure 3B:
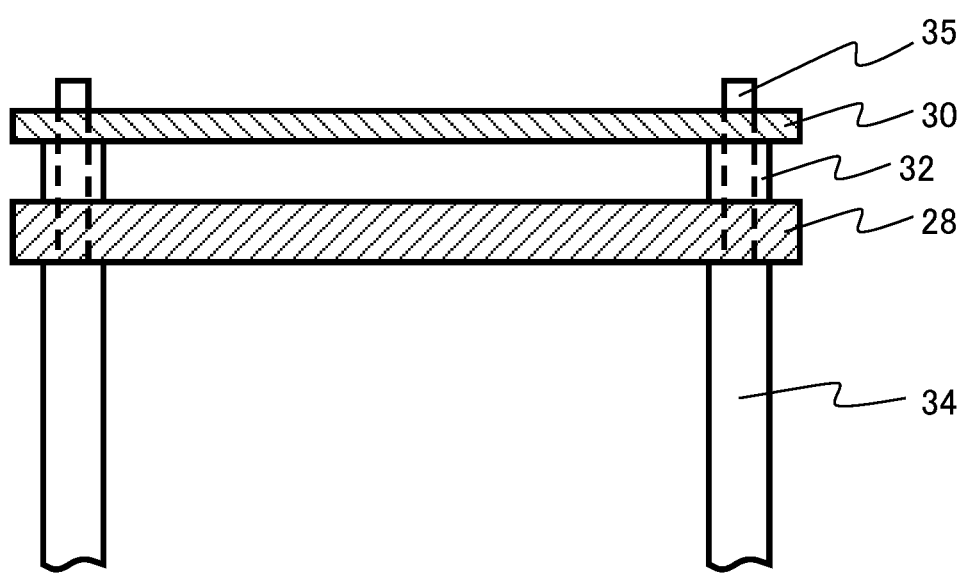

FIGS. 3A and 3B are cross-sectional views schematically illustrating an example of the reflector according to this embodiment. FIG. 3A illustrates a state before the adjustment reflector 30 is provided and FIG. 3B illustrates a state after the adjustment reflector 30 is provided.

As illustrated in FIG. 3A, for example, the standard reflector 28 are fixed by support shafts 35 provided in the support columns 34. The support shaft 35 passes through a hole provided in the standard reflector 28.

As illustrated in FIGS. 3A and 3B, the support portion 32 is, for example, a ring-shaped member through which the support shaft 35 passes. The adjustment reflector 30 is fixed by, for example, the support shafts 35 provided in the support columns 34. The support shaft 35 passes through a hole provided in the adjustment reflector 30. The adjustment reflector 30 is placed on the support portions 32.

For example, a push-up pin (not illustrated) is provided in the rotating unit 16 in order to attach or detach the wafer W to or from the ring-shaped holder 14. The push-up pin passes through, for example, the standard reflector 28, the adjustment reflector 30, and the in-heater 24.

As illustrated in FIG. 1, the gas outlet 40 is provided in the bottom of the reaction chamber 10. The gas outlet 40 discharges a reaction product generated after source gas reacts on the surface of the wafer W and process gas remaining in the reaction chamber 10 to the outside of the reaction chamber 10.

A wafer inlet and a gate valve (not illustrated) are provided in a wall surface 15 of the reaction chamber 10. The wafer W can be loaded to the reaction chamber 10 or can be unloaded from the reaction chamber 10 through the wafer inlet and the gate valve.

Next, a vapor phase growth method according to this embodiment will be described. The vapor phase growth method according to this embodiment uses the epitaxial growth apparatus illustrated in FIG. 1.

An example in which a stacked film of a plurality of InGaN (first nitride semiconductor) films and a plurality of GaN (second nitride semiconductor) films is formed on a GaN base film will be described. The stacked film is, for example, a multi-quantum well (MQW) layer used in a light emitting layer of a light emitting diode (LED). It has been known that the emission wavelength of the MQW layer sensitively depends on temperature during deposition. The uniform temperature distribution of a wafer during deposition is important in order to achieve high productivity.

In the vapor phase growth method according to this embodiment, first, a test wafer (first substrate) is loaded to the reaction chamber 10. For example, a substrate that is used in the actual process is preferably used as the test wafer. In the following example, a case in which the actual process is performed on a silicon substrate will be described. In the initial stage, the adjustment reflector 30 is not provided between the standard reflector 28 and the ring-shaped holder 14.

Then, the test wafer is placed on the ring-shaped holder 14. The test wafer is heated by the in-heater 24 and the out-heater 26 while being rotated by the rotating mechanism 20. The temperature distribution of the test wafer is measured while the test wafer is being maintained under predetermined conditions including temperature and a growth atmosphere which are adjusted to those in the growth conditions of the MQW. The temperature distribution is measured by, for example, a radiation thermometer.

After the temperature distribution of the test wafer is measured, the test wafer is unloaded from the reaction chamber 10.

Next, the adjustment reflector 30 with a pattern is manufactured on the basis of the measured temperature distribution of the test wafer.

The adjustment reflector 30 is made of a material having a compressive strength or a bending strength equal to or less than 1000 MPa or a material having a Vickers hardness equal to or less than 8 GPa. In this case, a disk-shaped material is processed to manufacture the adjustment reflector 30 having the plurality of inner-circumferential-side opening portions 42 and the plurality of outer-circumferential-side opening portions 44 illustrated in FIG. 2B. The pattern is processed by, for example, a cutter knife, a scroll saw cutting machine, a gas cutting apparatus, or a laser beam machining apparatus.

In the formation of the pattern of the adjustment reflector 30, for example, the adjustment reflector 30 is processed such that an opening portion is located immediately below a region of the wafer of which the temperature is to be lowered. However, the wafer is rotated during the process. Therefore, the influence of the opening portion provided in the adjustment reflector 30 is averaged by the rotation of the wafer. The ratio of the length of the opening portion provided in the adjustment reflector 30 along the rotation direction of the wafer to the length of a non-opening portion is adjusted to finely adjust the temperature distribution of the wafer.

Then, the adjustment reflector 30 is provided between the standard reflector 28 and the in-heater 24. Then, a wafer (second substrate) is loaded to the reaction chamber 10.

Then, the wafer is placed on the ring-shaped holder 14. The wafer is heated by the in-heater 24 and the out-heater 26 while being rotated by the rotating mechanism 20.

Then, AlN and AlGaN buffer layers are formed on the wafer, using TMA, TMG, and ammonia, and a GaN base layer is grown. Then, an InGaN layer and a GaN layer are alternately formed on the GaN base layer to form an MQW layer.

When the InGaN layer is formed, for example, a mixed gas of TMG and TMI having nitrogen gas as carrier gas is supplied from the first gas supply path 11 to the reaction chamber 10. In addition, for example, ammonia is supplied from the second gas supply path 12 to the reaction chamber 10. For example, nitrogen gas is supplied as diluent gas from the third gas supply path 13 to the reaction chamber 10.

When a GaN layer is formed, for example, TMG having nitrogen gas as carrier gas is supplied from the first gas supply path 11 to the reaction chamber 10. In addition, for example, ammonia is supplied from the second gas supply path 12 to the reaction chamber 10. For example, nitrogen gas is supplied as diluent gas from the third gas supply path 13 to the reaction chamber 10.

After the MQW layer is formed, the wafer is unloaded from the reaction chamber 10. While the MQW layer being formed as described above, a temperature distribution of the wafer during the deposition is more improved by the function of the adjustment reflector 30 than that when the adjustment reflector is not provided. Therefore, the uniformity of the emission wavelength is higher than that when the adjustment reflector 30 is not used.

In the vapor phase growth apparatus and the vapor phase growth method according to this embodiment, the adjustment reflector 30 for adjusting the temperature distribution of the wafer is made of a material that as easy to process. Specifically, a material with a compressive strength or a bending strength equal to or less than 1000 MPa or a material with a Vickers hardness equal to or less than 8 GPa is used.

It is preferable that the adjustment reflector 30 be a graphite sheet for ease of processing. The graphite sheet can be processed by a cutter knife. Therefore, it is possible to manufacture the adjustment reflector 30 with a pattern in a very short time.

It is preferable that the adjustment reflector 30 be provided between the standard reflector 28 and the in-heater 24 in order to improve the uniformity of the temperature distribution of the wafer.

It is preferable that the adjustment reflector 30 and the standard reflector 28 be separated from each other by a predetermined distance in order to improve the uniformity of the temperature distribution of the wafer. It is preferable that the distance between the adjustment reflector 30 and the standard reflector 28 be equal to or greater than 1 millimeter and equal to or less than 50 millimeters.

It is preferable that the center of gravity of the adjustment reflector 30 be the vicinity of the center of rotation of the holder in order to prevent the non-uniform deformation of the adjustment reflector 30 and to improve the uniformity of the temperature distribution of the wafer. It is preferable that the pattern of the adjustment reflector 30 be rotationally symmetric in order to make the center of gravity of the adjustment reflector 30 close to the center of rotation of the holder.

The example in which at least one of the compressive strength, bending strength, and Vickers hardness of the adjustment reflector 30 is lower than that of the standard reflector 28 has been described above. However, the adjustment reflector 30 and the standard reflector 28 may have the same compressive strength, bending strength, or Vickers hardness. The adjustment reflector 30 and the standard reflector 28 may be made of the same material.

The compressive strength or bending strength of the adjustment reflector 30 is preferably equal to or less than 800 MPa and is more preferably equal to or less than 500 MPa in order to easily process the adjustment reflector 30.

Before the wafer (second substrate) is loaded into the reaction chamber 10 after the adjustment reflector 30 is manufactured and provided in the reaction chamber 10, the temperature distribution of the test wafer may be measured again and the pattern of the adjustment reflector 30 may be adjusted. The measurement of the temperature distribution of the test wafer and the adjustment of the pattern of the adjustment reflector 30 may be repeatedly performed a plurality of times.

The example in which, when the temperature distribution of the test wafer is measured first, the adjustment reflector 30 is not provided between the standard reflector 28 and the in-heater 24 has been described above. However, when the temperature distribution of the test wafer is measured first, the adjustment reflector 30 with a predetermined pattern may be provided between the standard reflector 28 and the in-heater 24 in advance.

As described above, according to the vapor phase growth apparatus and the vapor phase growth method of this embodiment, it is possible to easily adjust the temperature distribution of the wafer to a desired temperature distribution.

Second Embodiment

A vapor phase growth method according to this embodiment includes: loading a first substrate to a reaction chamber including a holder, a heater, and a first reflector that is provided so as to face the holder, with the heater interposed therebetween; placing the first substrate on a holder; heating the first substrate with the heater while rotating the first substrate; supplying process gas to the reaction chamber to form a first film on the first substrate; measuring a characteristic distribution of the first film; manufacturing a second reflector with a pattern on the basis of the measured characteristic distribution; providing a second reflector between the first reflector and the heater; loading a second substrate to the reaction chamber; placing the second substrate on the holder; heating the second substrate with the heater while rotating the second substrate; and supplying the process gas to the reaction chamber to form a second film on the second substrate.

The vapor phase growth method according to this embodiment differs from the vapor phase growth method according to the first embodiment in that a "characteristic distribution" is a "characteristic distribution of a film". Hereinafter, the description of the same content as that in the first embodiment will not be repeated.

Here, the characteristic distribution of the film is a characteristic that depends on the temperature distribution of a wafer. The characteristics of the first film are, for example, the emission wavelength, thickness, chemical composition, and crystallinity of an MQW layer.

The vapor phase growth method according to this embodiment uses the epitaxial growth apparatus illustrated in FIG. 1. Hereinafter, the vapor phase growth method according to this embodiment will be described using, as an example, a case in which an MQW layer obtained by stacking a plurality of InGaN layers, which are first nitride semiconductor films, and a plurality of GaN layers, which are second nitride semiconductor films, is formed on a GaN base layer.

In the vapor phase growth method according to this embodiment, first, a test wafer (first substrate) is loaded into the reaction chamber 10. In this case, the adjustment reflector 30 is not provided between the standard reflector 28 and the ring-shaped holder 14.

After buffer layer made of, for example, AlN or AlGaN is formed on the test wafer on the basis of the actual process, the GaN base layer is formed. Then, the InGaN layers and the GaN layers are alternately stacked to form the MQW layer.

After the layers are formed, the test wafer is unloaded from the reaction chamber 10 and the photoluminescence (PL) of the MQW layer is measured.

The PL spectrum is measured by irradiating the MQW layer with excitation light and measuring, for example, the wavelength and intensity of fluorescent light emitted from the MQW layer.

Then, the adjustment reflector 30 is manufactured on the basis of the emission wavelength distribution of the MQW layer on the test wafer by PL measurement. It has been known that the emission wavelength of the MQW layer in PL measurement becomes shorter as the temperature during deposition increases. Therefore, the pattern of the adjustment reflector 30 is adjusted such that a portion with a shorter PL emission wavelength has a lower temperature.

Then, the adjustment reflector 30 is provided between the standard reflector 28 and the in-heater 24. Then, a wafer (second substrate) is loaded into the reaction chamber 10.

Then, an MQW layer is formed on a GaN base layer of the wafer, similarly to the test wafer, and PL measurement is performed.

According to the vapor phase growth method of this embodiment, the temperature distribution of a wafer is adjusted to easily adjust the characteristic distribution of the film formed on the wafer to a desired distribution.

Third Embodiment

A vapor phase growth apparatus according to this embodiment further includes: a first support portion that is provided between the first reflector and the second reflector and supports the second reflector such that the second reflector and the first reflector are separated from each other by a predetermined distance; and a second support portion that is provided between the first reflector and the second reflector, supports the second reflector such that the second reflector and the first reflector are separated from each other by a predetermined distance, and is closer to the center of rotation of the holder than the first support portion. The vapor phase growth apparatus according to this embodiment is the same as the vapor phase growth apparatus according to the first embodiment except that it includes the second support portion in addition to the first support portion. Therefore, the description of the same content as that in the first embodiment will not be repeated.

Figure 4:
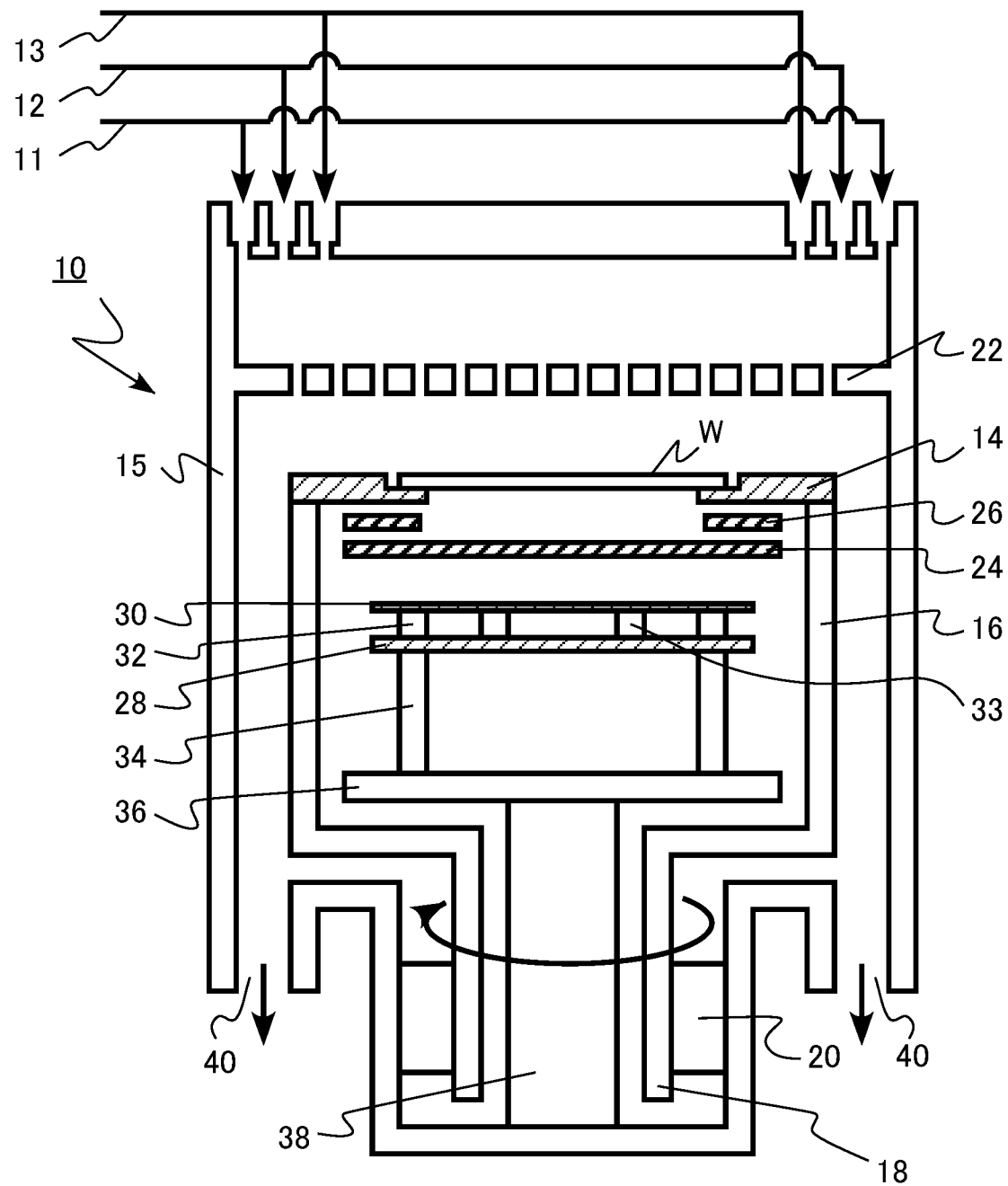
FIG. 4 is a cross-sectional view schematically illustrating a vapor phase growth apparatus according to a third embodiment.

FIG. 4 is a cross-sectional view schematically illustrating the vapor phase growth apparatus according to this embodiment. The vapor phase growth apparatus according to this embodiment is, for example, an epitaxial growth apparatus using an MOCVD method.

The vapor phase growth apparatus according to this embodiment includes a first support portion 32 and a second support portion 33. The first support portion 32 and the second support portion 33 are provided between the standard reflector (first reflector) 28 and the adjustment reflector (second reflector) 30.

The first support portion 32 and the second support portion 33 support the adjustment reflector 30. The second support portion 33 is provided at a position that is closer to the center of rotation of the ring-shaped holder 14 than the first support portion 32.

Figure 5:
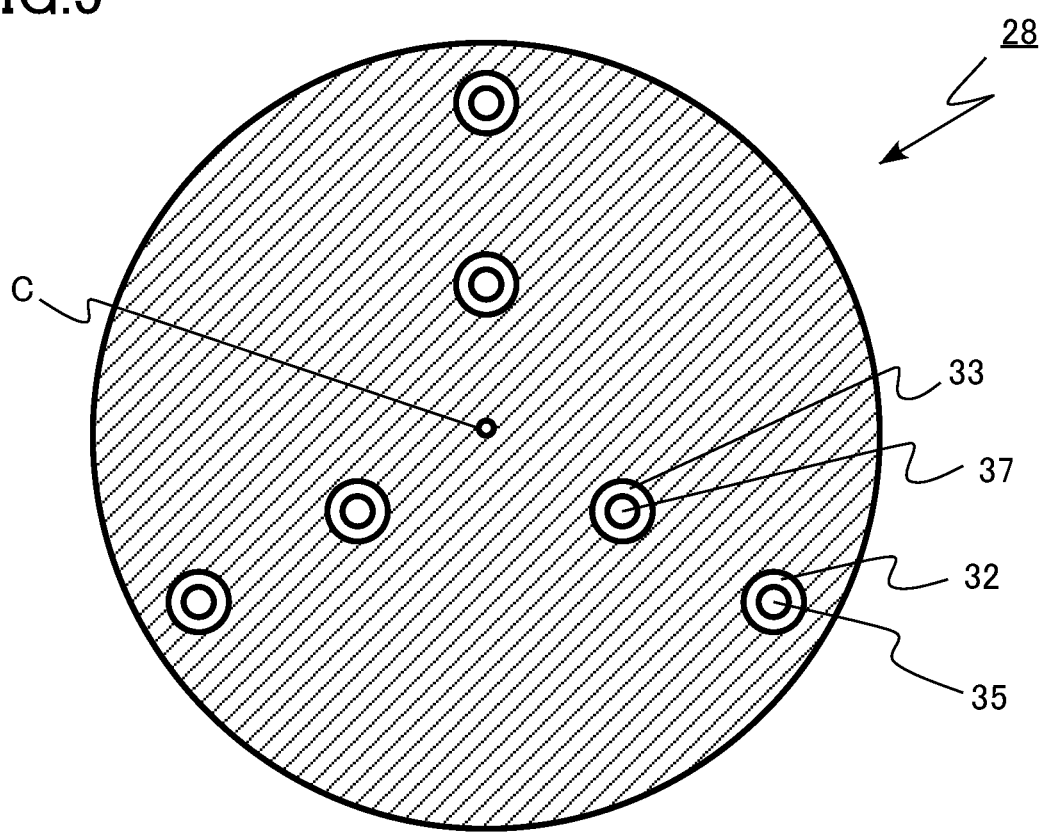
FIG. 5 is a plan view schematically illustrating an example of a reflector according to the third embodiment.

FIG. 5 is a plan view schematically illustrating an example of the reflector according to this embodiment. FIG. 5 illustrates the standard reflector 28.

As illustrated in FIG. 5, the standard reflector 28 has, for example, a disk shape. For example, three first support portions 32 are provided in an outer circumferential portion of the standard reflector 28. In addition, three second support portions 33 are provided in an inner circumferential portion of the standard reflector 28. In other words, the second support portion 33 is provided at a position that is closer to the center of rotation (C in FIG. 5) of the ring-shaped holder 14 than the first support portion 32.

The first support portion 32 is, for example, a ring-shaped member through which a support shaft 35 passes. The second support portion 33 is, for example, a ring-shaped member through which a push-up pin 37 used to attach and detach a wafer W passes. In FIG. 4, the push-up pin 37 is not illustrated.

The adjustment reflector 30 is made of a material that is easy to process. Therefore, in some cases, the adjustment reflector 30 is warped by its own weight. When the adjustment reflector 30 warps, it is difficult to stably adjust the temperature distribution of a wafer or the characteristics of a film. In particular, when the amount of warpage of the adjustment reflector 30 varies over time, the temperature distribution of a wafer or the characteristics of a film become unstable.

According to the vapor phase growth apparatus of this embodiment, since the second support portion 33 is provided inside the first support portion 32, the warpage of the adjustment reflector 30 is prevented. Therefore, it is possible to stably adjust the temperature distribution of a wafer or the characteristics of a film.

As described above, according to the vapor phase growth apparatus and the vapor phase growth method of this embodiment, it is possible to easily adjust the temperature distribution of a wafer or the characteristics of a film to a desired distribution. In addition, it is possible to stably adjust the temperature distribution of a wafer or the characteristics of a film.

Fourth Embodiment

A vapor phase growth apparatus according to this embodiment is the same as the vapor phase growth apparatus according to the first embodiment except that a distance between a first reflector and a second reflector is variable. Therefore, the description of the same content as that in the first embodiment will not be repeated.

Figure 6A:
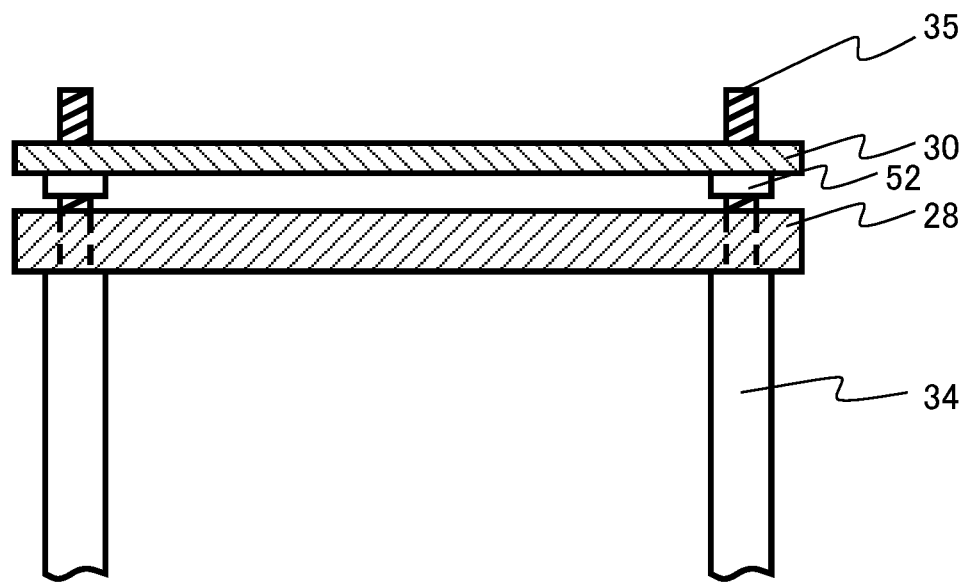
FIGS. 6A and 6B are cross-sectional views schematically illustrating an example of a reflector according to a fourth embodiment.
Figure 6B:
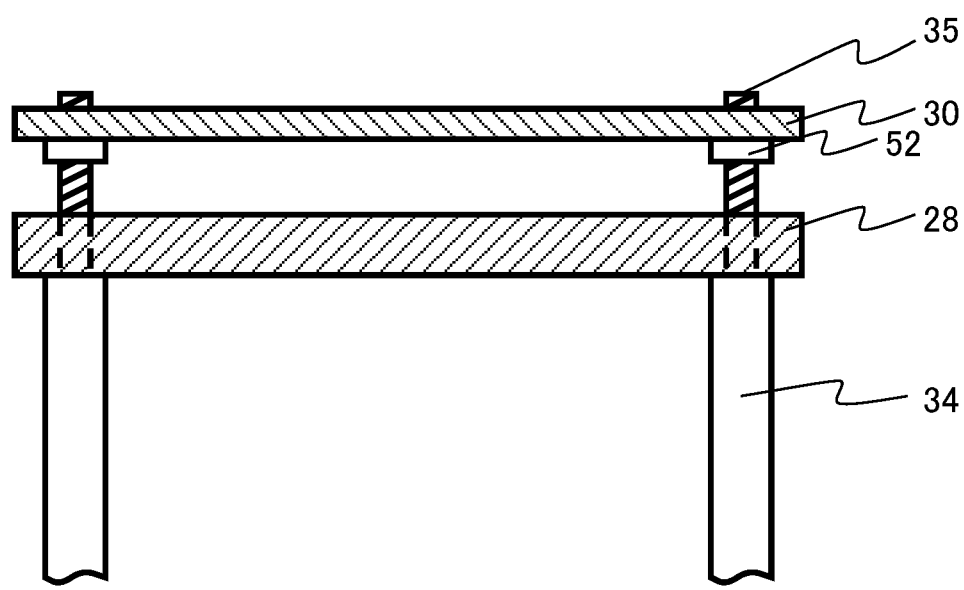

FIGS. 6A and 6B are cross-sectional views schematically illustrating an example of a reflector according to this embodiment. FIG. 6A illustrates a case in which the distance between the standard reflector (first reflector) 28 and the adjustment reflector (second reflector) 30 is short. FIG. 6B illustrates a case in which the distance between the standard reflector 28 and the adjustment reflector 30 is long.

For example, a screw thread is provided on an outer surface of a support shaft 35 provided in a support column 34. In addition, a support portion 52 is a ring-shaped member and has a screw thread provided on an inner surface. The support portion 52 is rotated to change the distance between the support portion 52 and the standard reflector 28.

As illustrated in FIG. 6A, the distance between the support portion 52 and the standard reflector 28 is reduced to decrease the distance between the standard reflector 28 and the adjustment reflector 30. In addition, as illustrated in FIG. 6B, the distance between the support portion 52 and the standard reflector 28 is increased to increase the distance between the standard reflector 28 and the adjustment reflector 30.

The temperature distribution of a wafer also depends on the distance between the standard reflector 28 and the adjustment reflector 30. In the vapor phase growth apparatus according to this embodiment, the distance between the standard reflector 28 and the adjustment reflector 30 is variable. Therefore, it is easier to adjust the temperature distribution of a wafer or the characteristics of a film than that in the first embodiment or the second embodiment.

Fifth Embodiment

A vapor phase growth apparatus according to this embodiment is the same as the vapor phase growth apparatus according to the fourth embodiment except that support portions with different lengths are used to change the distance between the first reflector and the second reflector. Therefore, the description of the same content as that in the fourth embodiment will not be repeated.

Figure 7A:
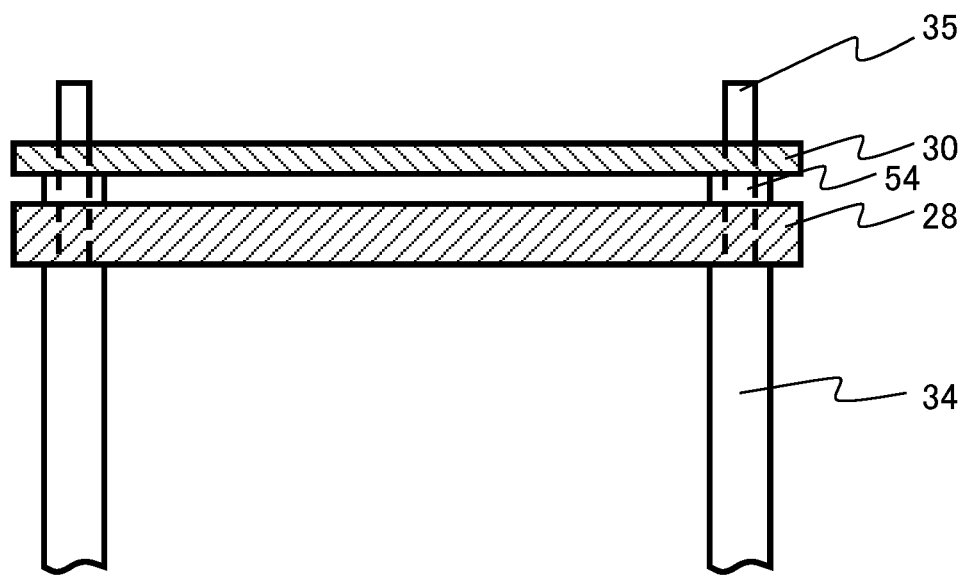
FIGS. 7A and 7B are cross-sectional views schematically illustrating an example of a reflector according to a fifth embodiment.
Figure 7B:
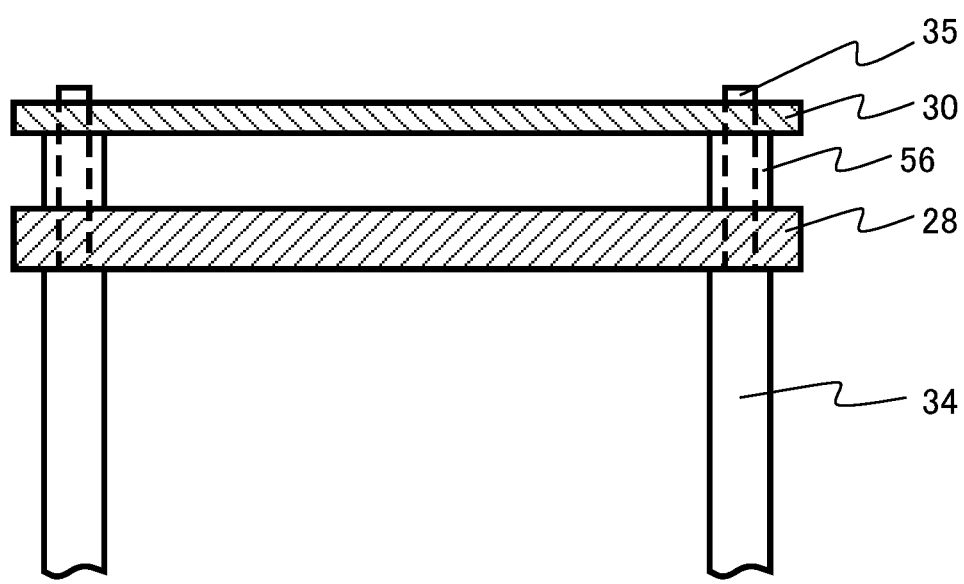

FIGS. 7A and 7B are cross-sectional views schematically illustrating an example of a reflector according to this embodiment. FIG. 7A illustrates a case in which the distance between the standard reflector 28 and the adjustment reflector 30 is short. FIG. 7B illustrates a case in which the distance between the standard reflector 28 and the adjustment reflector 30 is long.

For example, a short support portion 54 and a long support portion 56 are prepared. The support portion 54 and the support portion 56 are, for example, ring-shaped members through which support shafts 35 pass.

As illustrated in FIG. 7A, the short support portion 54 is used to reduce the distance between the standard reflector 28 and the adjustment reflector 30. In addition, as illustrated in FIG. 7B, the long support portion 56 is used to increase the distance between the standard reflector 28 and the adjustment reflector 30.

According to the vapor phase growth apparatus of this embodiment, to the fourth embodiment, it is easier to adjust the temperature distribution of a wafer or the characteristics of a film than that in the first embodiment or the second embodiment.

Sixth Embodiment

A vapor phase growth apparatus according to this embodiment is the same as the vapor phase growth apparatus according to the first embodiment except that the second reflector is provided so as to come into contact with the first reflector. Therefore, the description of the same content as that in the first embodiment will not be repeated.

Figure 8:
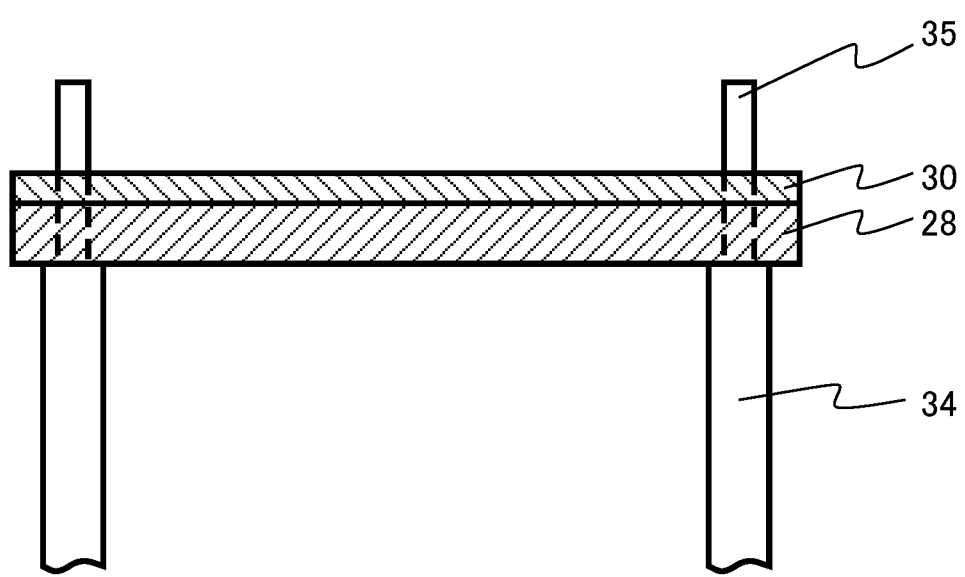
FIG. 8 is a cross-sectional view schematically illustrating an example of a reflector according to a sixth embodiment.

FIG. 8 is a cross-sectional view schematically illustrating an example of a reflector according to this embodiment. The adjustment reflector (second reflector) 30 is provided so as to come into contact with the standard reflector (first reflector) 28.

According to the vapor phase growth apparatus of this embodiment, similarly to the first embodiment or the second embodiment, it is easy to adjust the temperature distribution of a wafer or the characteristics of a film.

Seventh Embodiment

A vapor phase growth apparatus according to this embodiment is the same as the vapor phase growth apparatus according to the third embodiment except that the shape of the second reflector is different. Therefore, the description of the same content as that in the third embodiment will not be repeated.

Figure 9A:
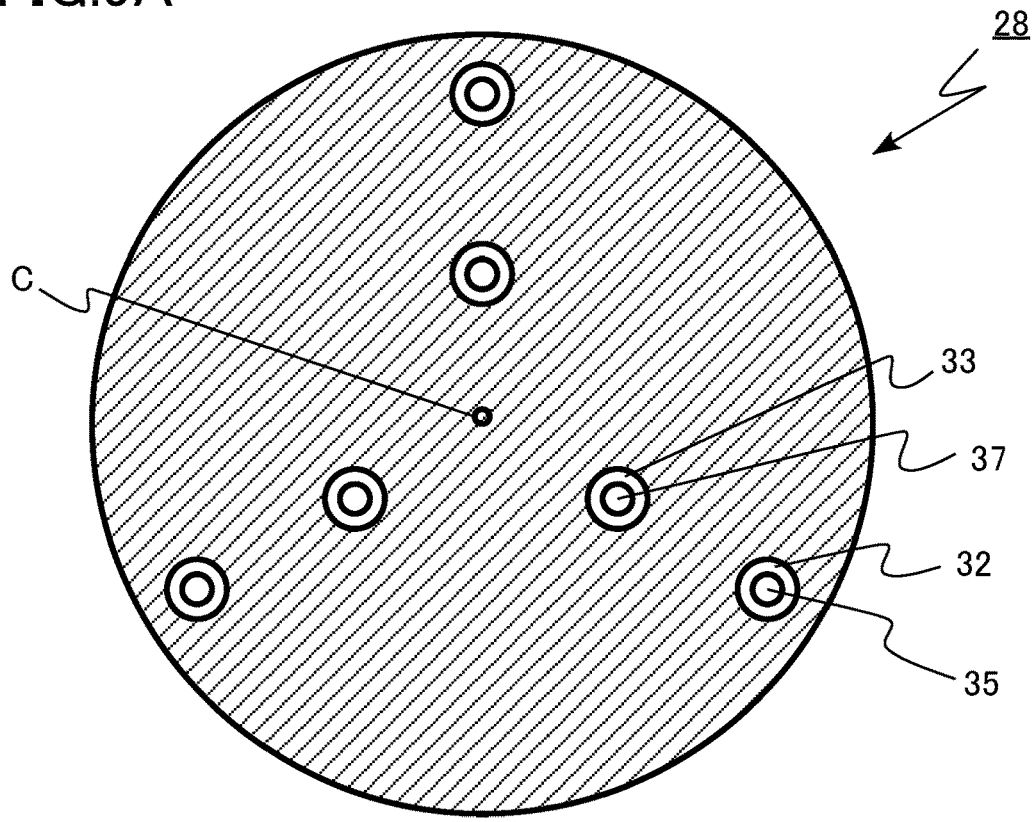
FIGS. 9A and 9B are plan views schematically illustrating an example of a reflector according to a seventh embodiment.
Figure 9B:
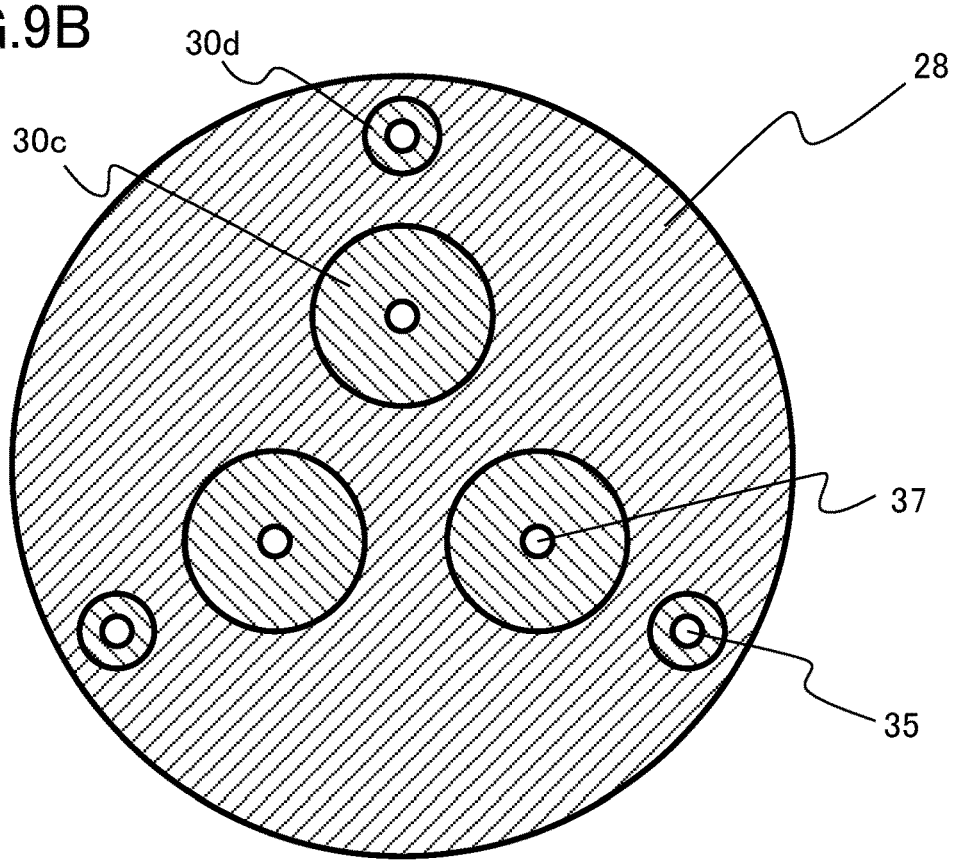

FIGS. 9A and 9B are plan views schematically illustrating an example of a reflector according to this embodiment. FIG. 9A illustrates a standard reflector 28. FIG. 9B illustrates a state in which an adjustment reflector 30 is provided above the standard reflector 28.

As illustrated in FIG. 9A, the standard reflector 28 has, for example, a disk shape. For example, three first support portions 32 are provided in an outer circumferential portion of the standard reflector 28. In addition, three second support portions 33 are provided in an inner circumferential portion of the standard reflector 28. In other words, the second support portion 33 is provided at a position that is closer to the center of rotation (C in FIG. 9) of the ring-shaped holder 14 than the first support portion 32.

The first support portion 32 is, for example, a ring-shaped member through which a support shaft 35 passes. The second support portion 33 is, for example, a ring-shaped member through which a push-up pin 37 used to attach and detach a wafer W passes.

As illustrated in FIG. 9B, the adjustment reflector 30 includes a plurality of disk-shaped reflectors. The adjustment reflector 30 includes a first adjustment reflector 30c and a second adjustment reflector 30d.

The first adjustment reflector 30c has a disk shape. The second adjustment reflector 30d has a disk shape with a diameter smaller than that of the first adjustment reflector 30c.

According to the vapor phase growth apparatus of this embodiment, similarly to the first embodiment or the second embodiment, it is easy to adjust the temperature distribution of a wafer or the characteristics of a film.

Eighth Embodiment

A vapor phase growth method according to this embodiment includes: heating a first substrate, using a heater and a reflector that has a first pattern and is opposite to the first substrate with the heater interposed therebetween; measuring a characteristic distribution of the first substrate under predetermined process conditions; and forming a film on a second substrate under the predetermined process conditions, using the heater and the reflector which has been changed to a second pattern different from the first pattern on the basis of the characteristic distribution.

The vapor phase growth method according to this embodiment differs from the vapor phase growth method according to the first embodiment in that an adjustment member (adjuster) is attached or detached to change the pattern of the adjustment reflector. In the vapor phase growth method according to this embodiment, a reflector has a detachable member and the member is attached or detached to change the pattern of the reflector from a first pattern to a second pattern. Hereinafter, the description of the same content as that in the first embodiment will not be repeated.

Next, the vapor phase growth method according to this embodiment will be described. The vapor phase growth method according to this embodiment uses the epitaxial growth apparatus illustrated in FIG. 1.

In the vapor phase growth method according to this embodiment, first, a test wafer (first substrate) is loaded into the reaction chamber 10. For example, a substrate that is used for the actual process is preferably used as the test wafer. Hereinafter, an example in which the actual process is performed on a silicon substrate will be described.

First, an adjustment reflector (reflector) 130 with the first pattern is provided between the standard reflector 28 and the ring-shaped holder 14. For convenience, a disk shape without an opening portion is also referred to as the first pattern.

Then, the test wafer is placed on the ring-shaped holder 14. The test wafer is heated by the in-heater 24 and the out-heater 26 while being rotated by the rotating mechanism 20. The temperature distribution of the test wafer is measured while the test wafer is being maintained under predetermined conditions including temperature and a growth atmosphere which are adjusted to those in the growth conditions of the MQW. The temperature distribution is measured by, for example, a radiation thermometer.

After the temperature of the test wafer is measured, the test wafer is unloaded from the reaction chamber 10.

Then, the pattern of the adjustment reflector 130 is changed from the first pattern to the second pattern different from the first pattern, on the basis of the measured temperature distribution of the test wafer.

Figure 10A:
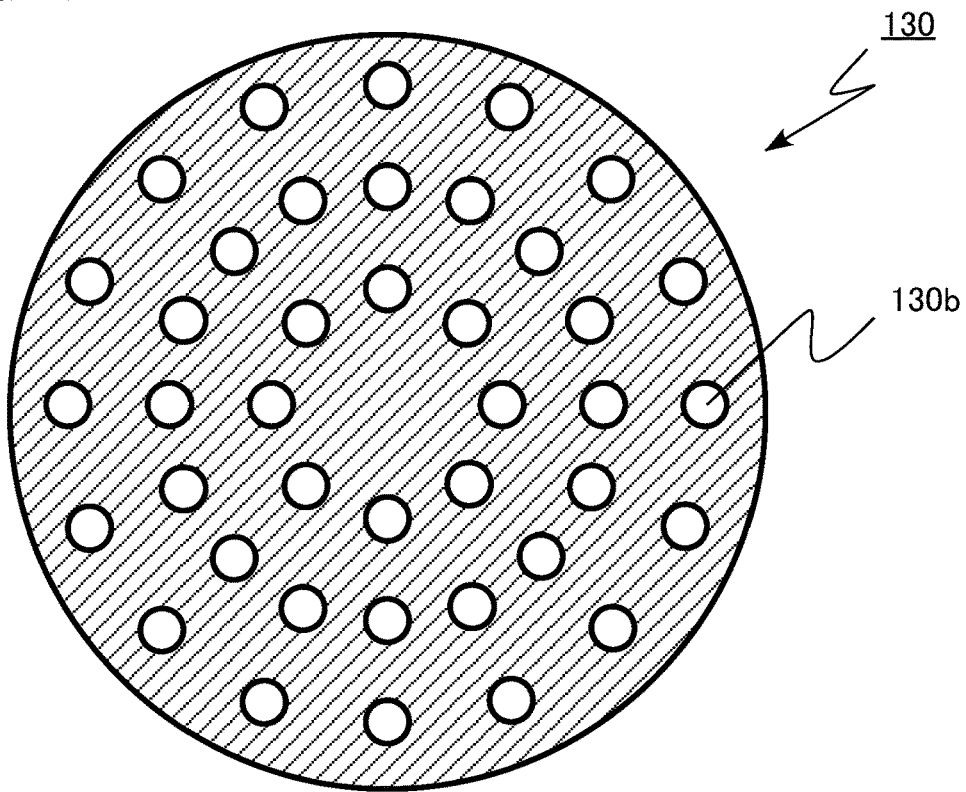
FIGS. 10A and 10B are plan views schematically illustrating an example of a reflector according to an eighth embodiment.
Figure 10B:
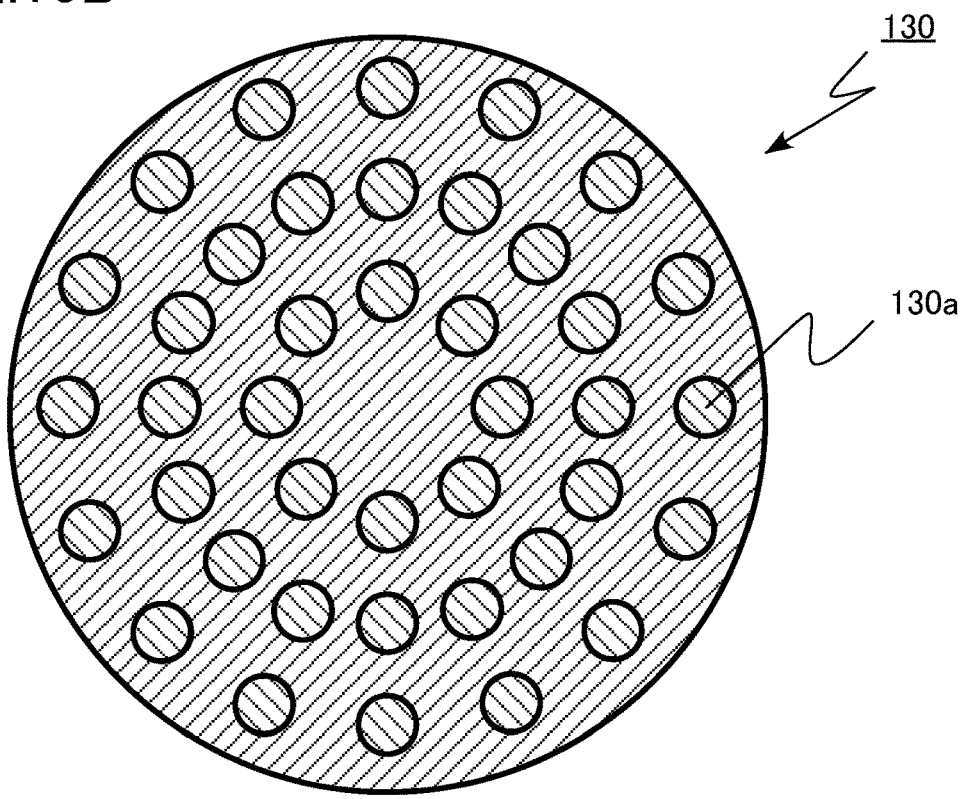

FIGS. 10A and 10B are plan views schematically illustrating an example of a reflector according to this embodiment. FIGS. 10A and 10B illustrate the adjustment reflector 130. FIG. 10A illustrates a state in which an adjustment member 130a (adjuster) is completely removed from the adjustment reflector 130. FIG. 10B illustrates a state in which the adjustment member 130a is completely attached to the adjustment reflector 130.

As illustrated in FIG. 10A for example, a plurality of opening portions 130b are provided in the adjustment reflector 130. A plurality of opening portions are not necessarily provided and one opening portion may be provided. As illustrated in FIG. 10B, the adjustment member 130a is attached to cover the plurality of opening portions 130b.

The adjustment reflector 130 and the adjustment member 130a are made of, for example, graphite coated with SiC.

Figure 11A:
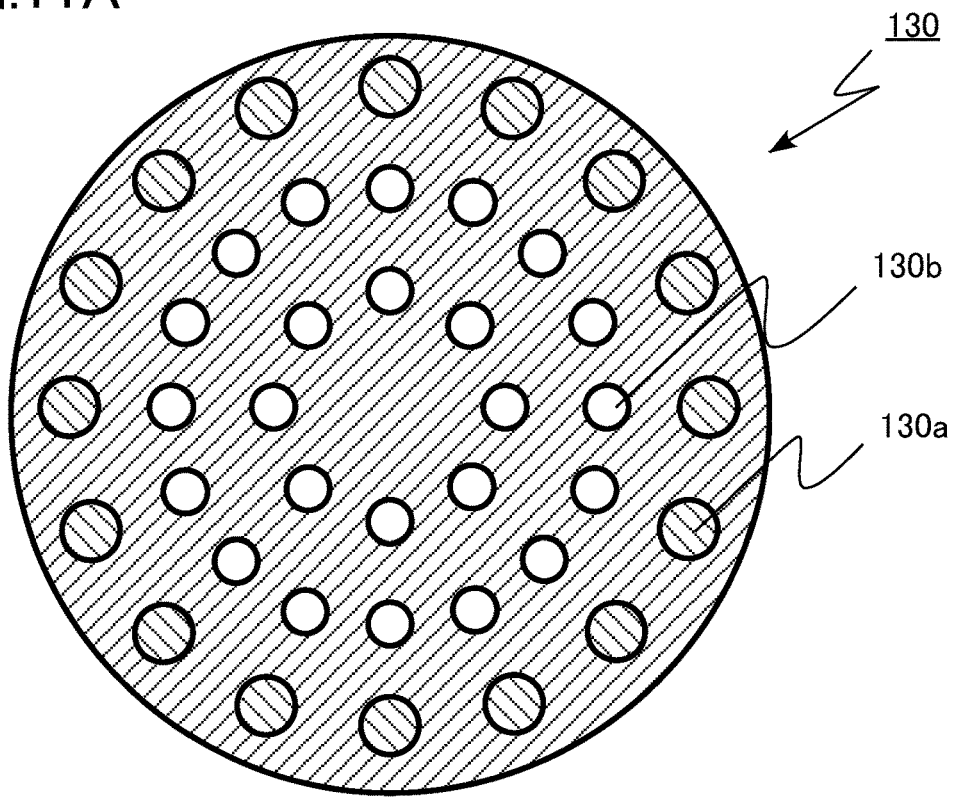
FIGS. 11A and 11B are plan views schematically illustrating an example of the reflector according to the eighth embodiment.
Figure 11B:
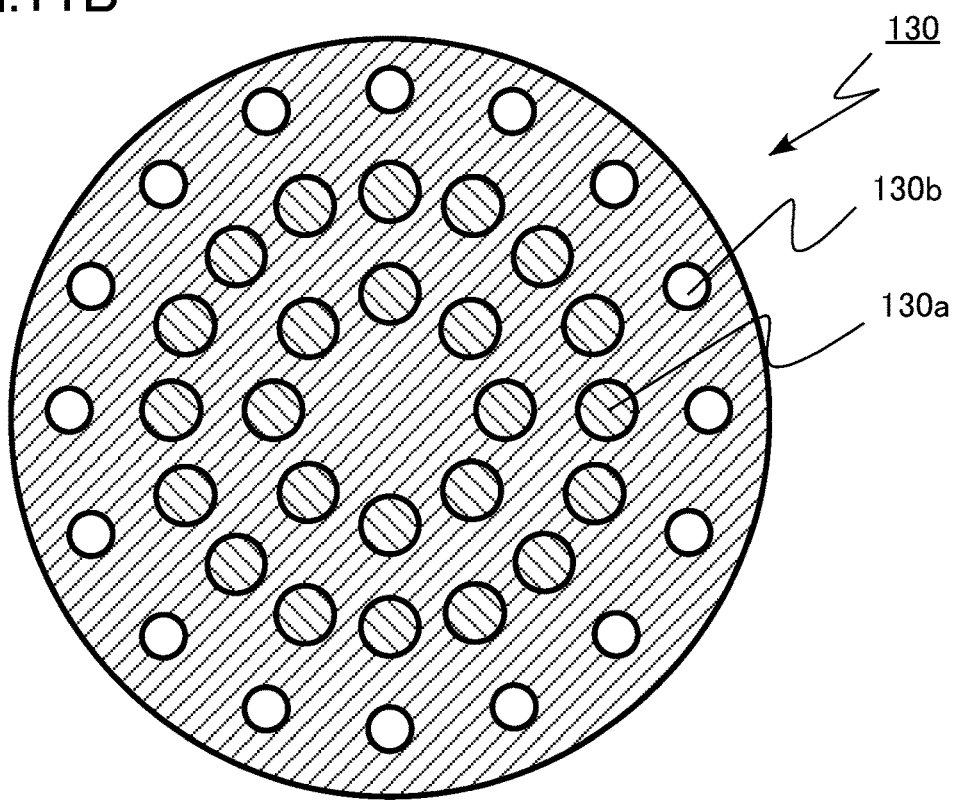

FIGS. 11A and 11B are plan views schematically illustrating an example of the reflector according to this embodiment. FIG. 11A illustrates a state in which outermost-circumferential opening portions 130b of an adjustment reflector 130 are covered by an adjustment member 130a. FIG. 11B illustrates a state in which opening portions 130b other than outermost-circumferential opening portions 130b of an adjustment reflector 130 are covered by an adjustment member 130a.

For example, the pattern illustrated in FIG. 10A is used as the first pattern. When the temperature distribution of the test wafer is measured and the user wants to relatively increase, for example, the temperature of the outer circumference of the test wafer, the pattern illustrated in FIG. 11A is used as the second pattern. For example, when the user wants to relatively reduce the temperature of the outer circumference of the test wafer, the pattern illustrated in FIG. 11B is used as the second pattern.

For example, the pattern illustrated in FIG. 10B, FIG. 11A, or FIG. 11B may be used as the first pattern.

Then, the wafer is placed on the ring-shaped holder 14. The wafer is heated by the in-heater 24 and the out-heater 26 while being rotated by the rotating mechanism 20.

Then, AlN and AlGaN buffer layers are formed on the wafer, using TMA, TMG, and ammonia, and a GaN base layer is grown. Then, an InGaN layer and a GaN layer are alternately formed on the GaN base layer to form an MQW layer.

After the MQW layer is formed, the wafer is unloaded from the reaction chamber 10. In the MQW layer formed as described above, a temperature distribution during deposition is more improved by the function of the adjustment reflector 130 than that when the pattern of the adjustment reflector is the first pattern. Therefore, the uniformity of the emission wavelength is higher than that when the adjustment reflector 130 is not used.

The shape of the adjustment member 130a and the opening portion 130b is not limited to a circle. For example, the adjustment member 130a and the opening portion 130b may have shapes other than the circular shape, such as a triangular shape, a rectangular shape, and other polygonal shapes.

The example in which the adjustment member 130a is attached to or detached from the opening portion 130b to change the pattern of the adjustment reflector 130 from the first pattern to the second pattern has been described. However, for example, a sheet-shaped adjustment member 130a that has been prepared in advance may be attached to or detached from the surface of a disk-shaped adjustment reflector 130 to change the pattern from the first pattern to the second pattern.

The adjustment reflector 130 and the adjustment member 130a may be made of the same material or different materials. For example, a material with a reflectance different from the reflectance of the material forming the adjustment reflector 130 may be applied to the adjustment member 130a.

As described above, according to the vapor phase growth method of this embodiment, it is possible to easily adjust the temperature distribution of a wafer to a desired temperature distribution.

Ninth Embodiment

A vapor phase growth apparatus according to this embodiment includes: a reaction chamber; a holder which is provided in the reaction chamber and on which a substrate is placed; a heater that heats the substrate; a first reflector that is provided so as to face the holder with the heater interposed therebetween; a second reflector that is provided between the first reflector and the heater and includes a first portion with a first sub-pattern and a second portion with a second sub-pattern, the first portion and the second portion being relatively rotatable; and a rotating shaft that is fixed to the holder and rotates the holder.

The vapor phase growth apparatus according to this embodiment differs from the vapor phase growth apparatus according to the first embodiment in that the second reflector includes a first portion and a second portion which can be rotated relative to each other. Hereinafter, the description of the same content as that in the first embodiment will not be repeated.

A vapor phase growth method according to this embodiment differs from the vapor phase growth method according to the eighth embodiment in that a reflector has a first portion with a first sub-pattern and a second portion with a second sub-pattern and the pattern of the reflector is changed from a first pattern to a second pattern by the relative rotation between the first portion and the second portion. Hereinafter, the description of the same content as that in the eighth embodiment will not be repeated.

The vapor phase growth apparatus according to this embodiment includes a standard reflector 28 (first reflector) and an adjustment reflector 230 (second reflector). The standard reflector 28 has the same structure as that in the first embodiment.

Figure 17A:
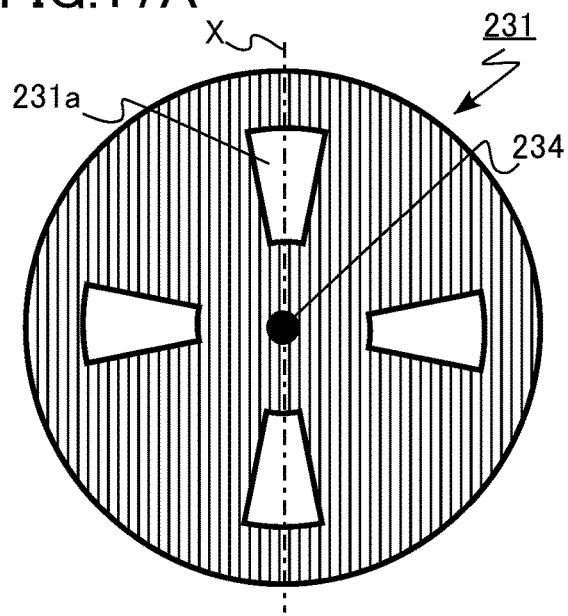
FIGS. 17A, 17B, 17C, and 17D are diagrams schematically illustrating an example of a reflector according to a ninth embodiment.
Figure 17B:
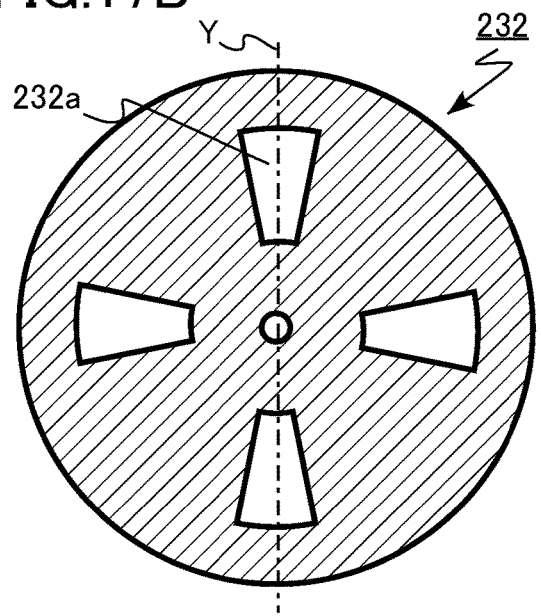
Figure 17C:
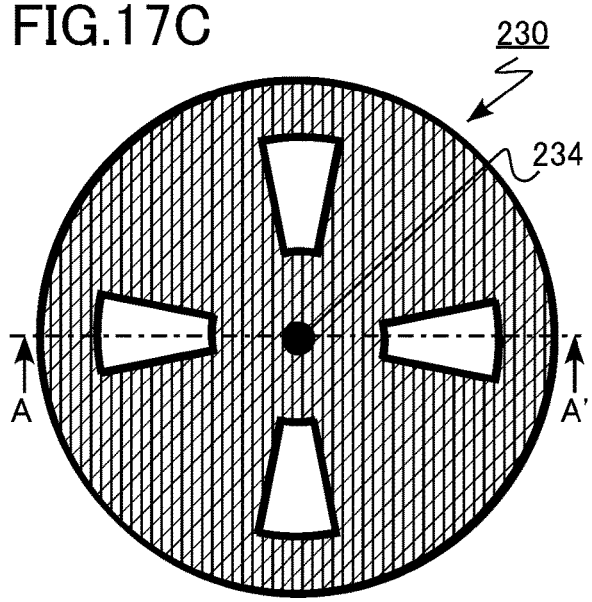
Figure 17D:
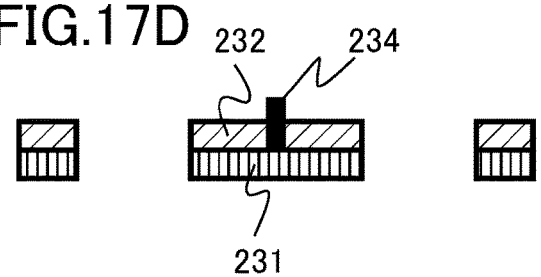

FIGS. 17A, 17B, 17C, and 17D are diagrams schematically illustrating an example of the adjustment reflector according to this embodiment. FIGS. 17A, 17B, and 17C are top views illustrating the reflector and FIG. 17D is a cross-sectional view taken along the line AA' of FIG. 17C.

The adjustment reflector 230 includes a base reflector 231 (first portion) and a cover reflector 232 (second portion). The adjustment reflector 230 includes a fixed shaft 234. The fixed shaft 234 is the center of the relative rotation between the base reflector 231 and the cover reflector 232.

The base reflector 231 and the cover reflector 232 are made of, for example, ceramics or metal. The base reflector 231 and the cover reflector 232 can be made of ceramics, such as silicon carbide (SiC), graphite, pyrolytic graphite (PG), pyrolytic boron nitride (PBN), sintered boron nitride (hBN), or tantalum carbide (TaC). In addition, high-melting-point metal, such as tungsten, molybdenum, or rhenium, can be used as metal. For example, a material obtained by coating a base material, such as graphite, with SiC, PBN, PG, or TaC can be used. Furthermore, a carbon fiber reinforced carbon composite (C/C composite), sintered boron nitride (hBN), or a mixture of sintered boron nitride (hBN) and silicon nitride can be used.

FIG. 17A illustrates the base reflector 231 and FIG. 17B illustrates the cover reflector 232. FIGS. 17C and 17D illustrate a state in which the cover reflector 232 is superimposed on the base reflector 231. The fixed shaft 234 passes through the cover reflector 232.

As illustrated in FIG. 17A, the base reflector 231 has the first sub-pattern. The first sub-pattern includes four hole patterns 231a. The hole patterns 231a have a symmetry axis X that passes through the center of rotation. The hole patterns 231a are line symmetric with respect to the symmetry axis X.

As illustrated in FIG. 17B, the cover reflector 232 has the second sub-pattern. The second sub-pattern includes four hole patterns 232a. The hole patterns 232a have a symmetry axis Y that passes through the center of rotation. The hole patterns 232a are line symmetric with respect to the symmetry axis Y.

As illustrated in FIG. 17C, the cover reflector 232 is superimposed on the base reflector 231 such that the first sub-pattern and the second sub-pattern overlap each other. In this way, the pattern of the adjustment reflector 230 is formed.

FIGS. 18A, 18B, 18C, 18D, and 18E are diagrams illustrating a change in the pattern of the adjustment reflector according to this embodiment. FIGS. 18A, 18B, 18C, 18D, and 18E illustrate an aspect in which the cover reflector 232 is rotated on the fixed shaft 234 with respect to the base reflector 231 by a predetermined rotation angle to change the pattern of the adjustment reflector 230.

Figure 18A:
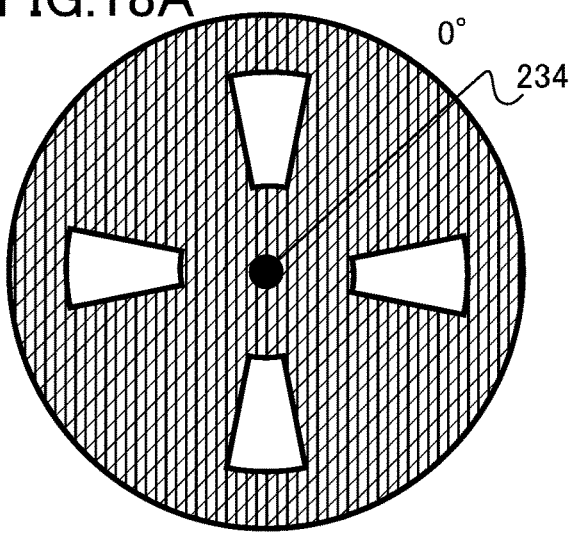
FIGS. 18A, 18B, 18C, 18D, and 18E are diagrams illustrating a change in a pattern of an adjustment reflector according to the ninth embodiment.
Figure 18B:
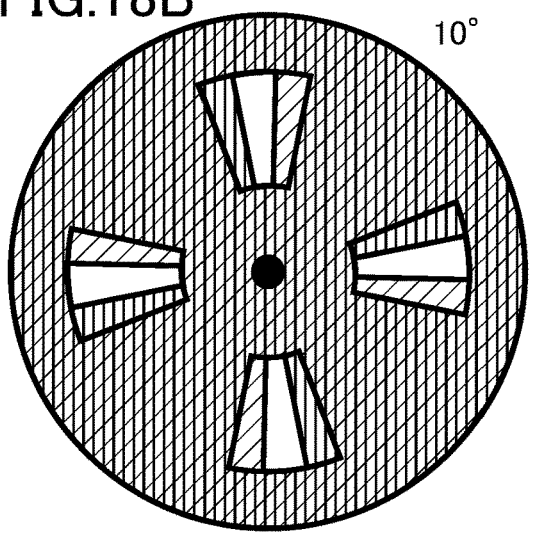
Figure 18C:
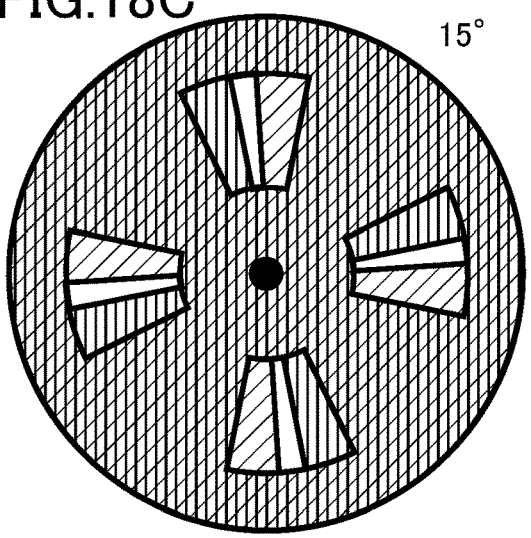
Figure 18D:
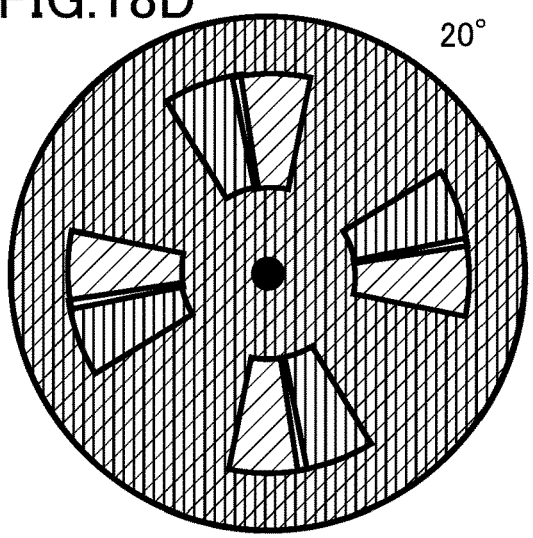
Figure 18E:
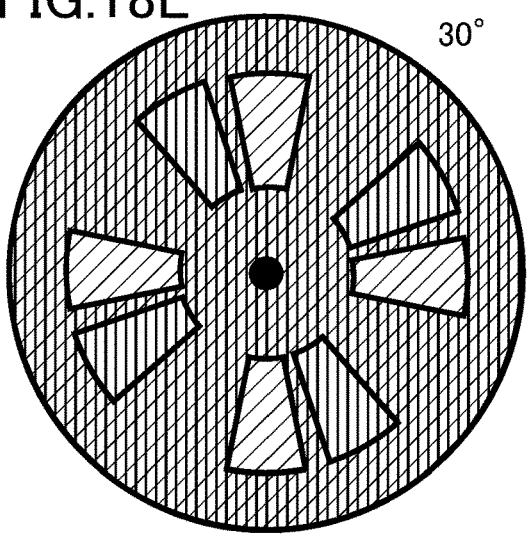

FIG. 18A illustrates a state in which the hole pattern 231a of the base reflector 231 and the hole pattern 232a of the cover reflector 232 completely overlap each other. It is assumed that the rotation angle of the pattern illustrated in FIG. 18A is 0 degree. For example, the pattern illustrated in FIG. 18A is referred to as the first pattern.

FIGS. 18B, 18C, 18D, and 18E illustrate patterns obtained by rotating the cover reflector 232 in a counterclockwise direction by 10 degrees, 15 degrees, 20 degrees, and 30 degrees from the pattern illustrated in FIG. 18A, respectively. For example, the patterns illustrated in FIGS. 18A, 18B, 18C, 18D and 18E are referred to as the second pattern.

The base reflector 231 and the cover reflector 232 are relatively rotated to change the pattern of the adjustment reflector 230 from the first pattern to the second pattern. The base reflector 231 and the cover reflector 232 are relatively rotated to change the degree of overlap between the first sub-pattern and the second sub-pattern. The base reflector 231 and the cover reflector 232 are relatively rotated to change the opening area of the adjustment reflector 230.

In the case of the pattern illustrated in FIG. 18A, the adjustment reflector 230 has the largest opening area. The opening areas of the adjustment reflectors 230 are reduced in the order of FIGS. 18B, 18C, and 18D. In the case of the pattern illustrated in FIG. 18E, the adjustment reflector 230 does not have an opening portion and has the smallest opening area.

According to the vapor phase growth apparatus and the vapor phase growth method of this embodiment, since the pattern of the adjustment reflector 230 is changed from the first pattern to the second pattern, it is possible to easily adjust the characteristic distribution of the wafer W. The characteristic distribution of the wafer W is, for example, the temperature distribution of the wafer W.

The base reflector 231 and the cover reflector 232 are relatively rotated to continuously change the pattern of the adjustment reflector 230. For example, the opening area of the adjustment reflector 230 is continuously changed. Therefore, it is easy to accurately adjust the characteristic distribution of the wafer W.

The pattern of the adjustment reflector 230 is changed only by relatively rotating the base reflector 231 and the cover reflector 232. Therefore, for example, it is possible to change the pattern of the adjustment reflector 230 from the first pattern to the second pattern, without disassembling the in-heater 24 or the out-heater 26. As a result, it is possible to adjust the characteristic distribution of the wafer W in a short time.

The example in which the first sub-pattern of the base reflector 231 is the hole pattern 231a has been described above. However, the invention is not limited to the case in which the first sub-pattern is the hole pattern 231a. For example, the first sub-pattern may be formed by providing a pattern, which has a reflectance different from that of other regions, in the surface of the base reflector 231. The pattern having a reflectance different from that of other regions is, for example, a pattern that is made of a material different from that forming other regions.

Tenth Embodiment

A vapor phase growth apparatus and a vapor phase growth method according to this embodiment differ from the vapor phase growth apparatus and the vapor phase growth method according to the ninth embodiment in that at least one of the first sub-pattern and the second sub-pattern has a hole pattern and the hole pattern does not have a symmetry axis which passes through the center of rotation of the first portion or a symmetry axis which passes through the center of rotation of the second portion. Hereinafter, the description of the same content as that in the ninth embodiment will not be repeated.

Figure 19A:
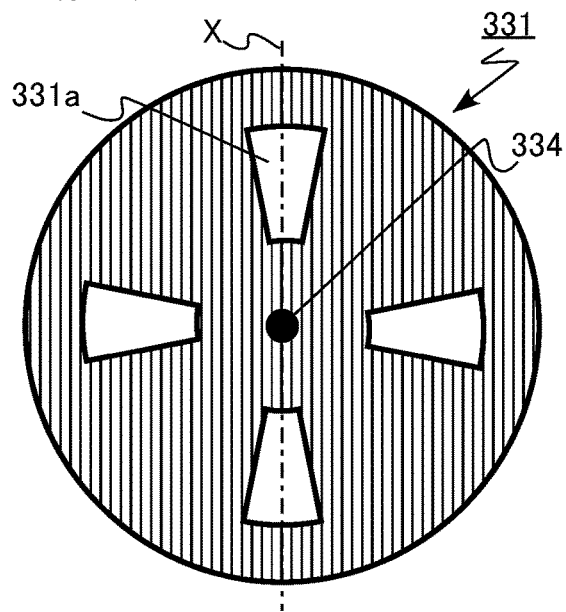
FIGS. 19A, 19B, 19C, and 19D are diagrams schematically illustrating an example of a reflector according to a tenth embodiment.
Figure 19B:
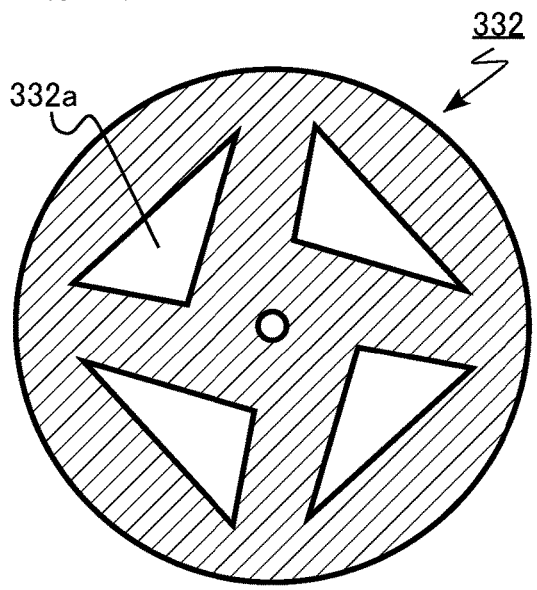
Figure 19C:
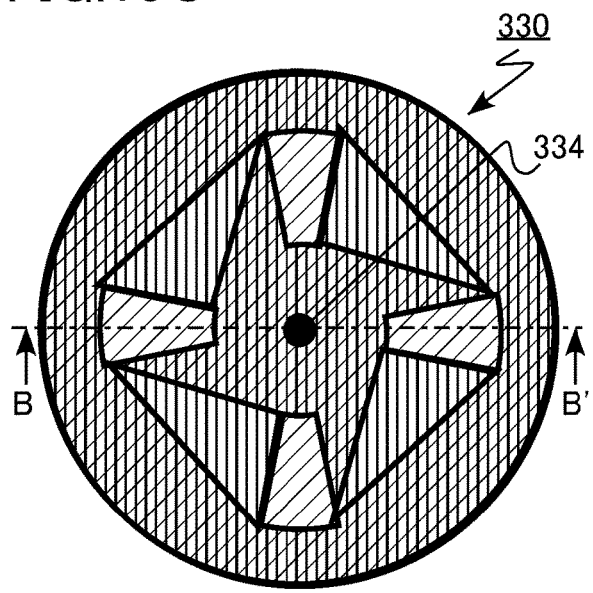
Figure 19D:
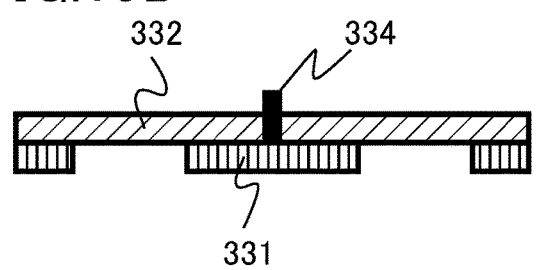

FIGS. 19A, 19B, 19C, and 19D are diagrams schematically illustrating an example of an adjustment reflector according to this embodiment. FIGS. 19A, 19B, and 19C are top views illustrating a reflector and FIG. 19D is a cross-sectional view taken along the line BB' of FIG. 19C.

An adjustment reflector 330 includes a base reflector 331 (first portion) and a cover reflector 332 (second portion). The adjustment reflector 330 includes a fixed shaft 334. The fixed shaft 334 is the center of the relative rotation between the base reflector 331 and the cover reflector 332.

FIG. 19A illustrates the base reflector 331 and FIG. 19B illustrates the cover reflector 332. FIGS. 19C and 19D illustrate a state in which the cover reflector 332 is superimposed on the base reflector 331.

As illustrated in FIG. 19A, the base reflector 331 has a first sub-pattern. The first sub-pattern include four hole patterns 331a. The hole patterns 331a have a symmetry axis X that passes through the center of rotation. The hole patterns 331a are line symmetric with respect to the symmetry axis X.

As illustrated in FIG. 19B, the cover reflector 332 has a second sub-pattern. The second sub-pattern includes four hole patterns 332a. The hole patterns 332a do not have a symmetry axis that passes through the center of rotation. In other words, the hole patterns 332a are not line symmetric as viewed from the circumferential direction of the cover reflector 332.

As illustrated in FIGS. 19C and 19D, the cover reflector 332 is superimposed on the base reflector 331 such that the first sub-pattern and the second sub-pattern overlap each other. In this way, the pattern of the adjustment reflector 330 is formed.

FIGS. 20A, 20B, 20C, 20D, 20E, 20F, 21A and 21B are diagrams illustrating a change in the pattern of the adjustment reflector according to this embodiment. FIGS. 20A, 20B, 20C, 20D, 20E, 20F, 21A, and 21B illustrate an aspect in which the cover reflector 332 is rotated on the fixed shaft 334 with respect to the base reflector 331 by a predetermined rotation angle to change the pattern of the adjustment reflector 330.

Figure 20A:
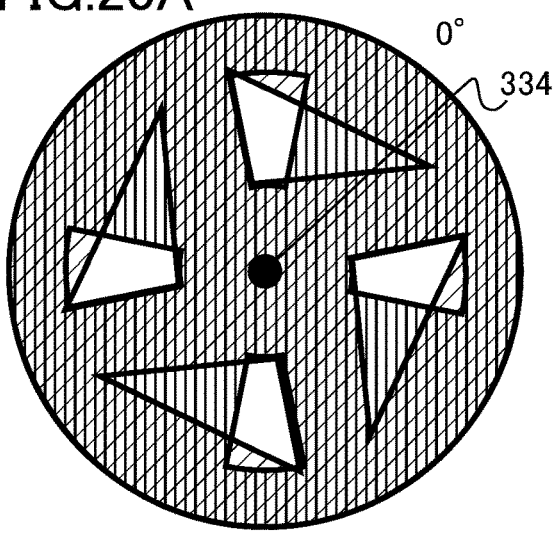
FIGS. 20A, 20B, 20C, 20D, 20E, and 20F are diagrams illustrating a change in a pattern of an adjustment reflector according to the tenth embodiment.
Figure 20B:
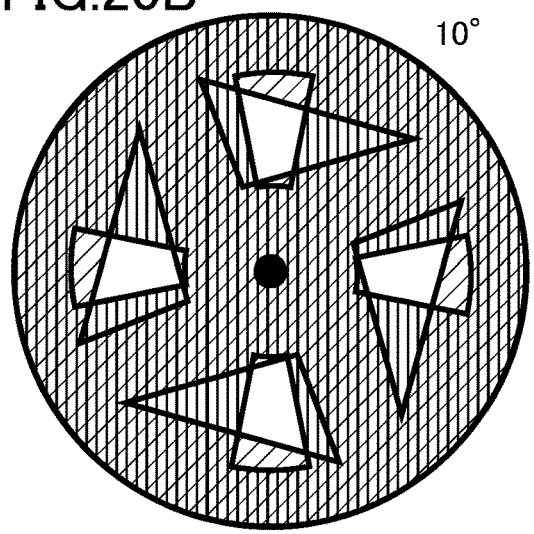
Figure 20C:
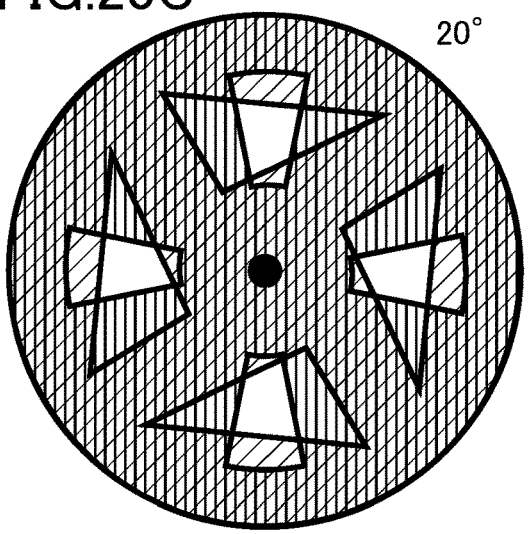
Figure 20D:
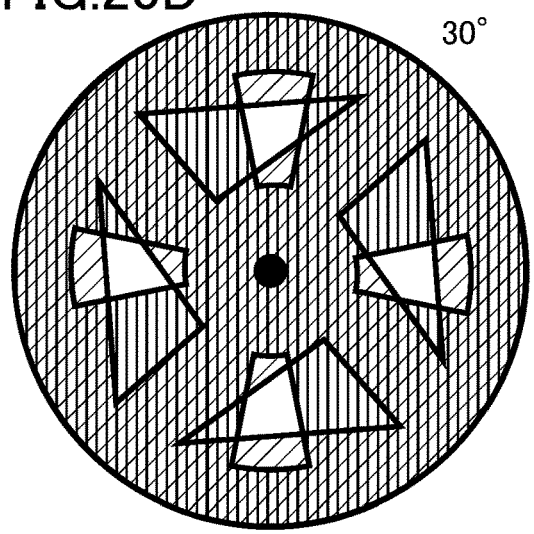
Figure 20E:
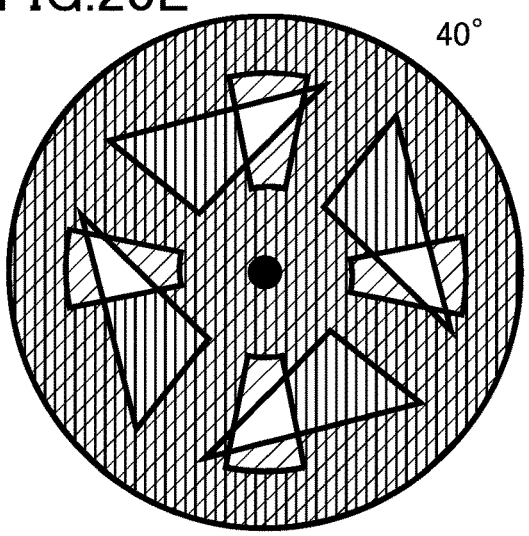
Figure 20F:
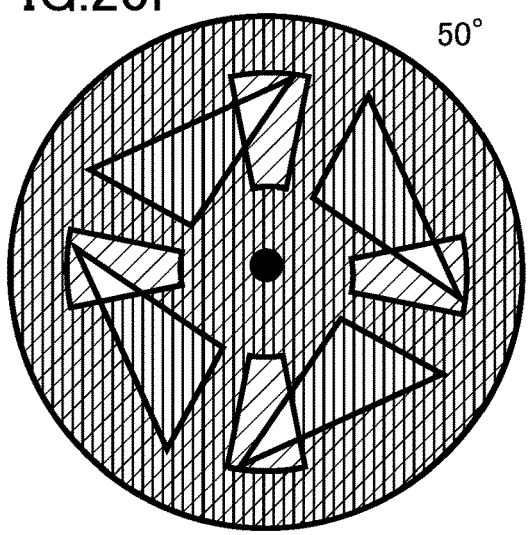
Figure 21A:
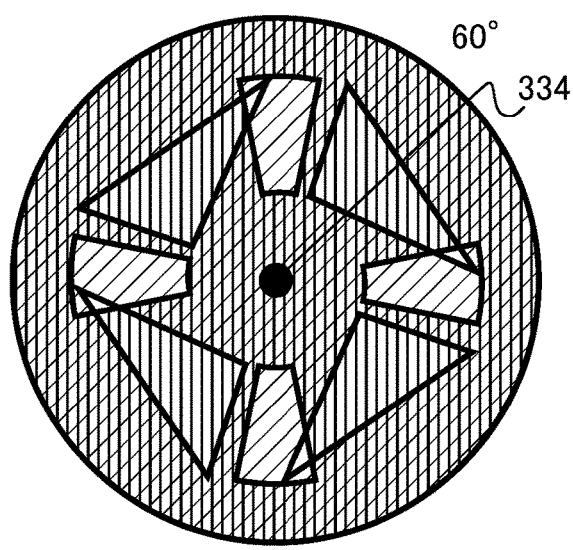
FIGS. 21A and 21B are diagrams illustrating a change in the pattern of the adjustment reflector according to the tenth embodiment.
Figure 21B:
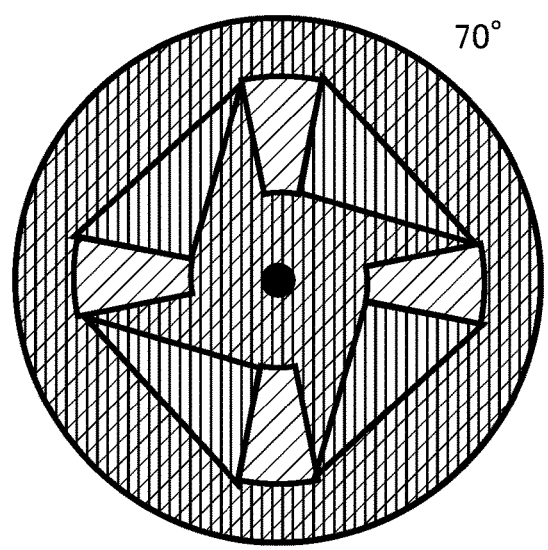

FIG. 20A illustrates a state in which the hole pattern 331a of the base reflector 331 and the hole pattern 332a of the cover reflector 332 overlap each other. It is assumed that the rotation angle of the pattern illustrated in FIG. 20A is 0 degree. For example, the pattern illustrated in FIG. 20A is referred to as a first pattern.

FIGS. 20B, 20C, 20D, 20E, 20F, 21A, and 21B illustrate patterns obtained by rotating the cover reflector 332 in a counterclockwise direction by 10 degrees, 20 degrees, 30 degrees, 40 degrees, 50 degrees, 60 degrees, and 70 degrees from the pattern illustrated in FIG. 20A, respectively. For example, the patterns illustrated in FIGS. 20B, 20C, 20D, 20E, 20F, 21A, and 21B are referred to as a second pattern.

The base reflector 331 and the cover reflector 332 are relatively rotated to change the pattern of the adjustment reflector 330 from the first pattern to the second pattern. The base reflector 331 and the cover reflector 332 are relatively rotated to change the degree of overlap between the first sub-pattern and the second sub-pattern. The base reflector 331 and the cover reflector 332 are relatively rotated to change the opening area of the adjustment reflector 330.

In the case of the pattern illustrated in FIG. 20A, the adjustment reflector 330 has the largest opening area. The opening areas of the adjustment reflectors 330 are reduced in the order of FIGS. 20B, 20C, 20D, 20E, 20F, and 21A. In the case of the pattern illustrated in FIG. 21B, the adjustment reflector 330 does not have an opening portion and has the smallest opening area.

According to the vapor phase growth apparatus and the vapor phase growth method of this embodiment, the same effect as that in the ninth embodiment is obtained. In addition, since the hole pattern 332a of the cover reflector 332 is not line symmetric as viewed from the circumferential direction of the cover reflector 332, the rate of change in the opening area of the adjustment reflector 330 with respect to the rotation angle is not asymmetric. For example, there is a difference between the rate of change in the opening area respect to the rotation angle when the cover reflector 332 is rotated in the counterclockwise direction and the rate of change in the opening area respect to the rotation angle when the cover reflector 332 is rotated in the clockwise direction. The use of the asymmetry of the hole pattern 332a makes it possible to achieve a complicated pattern change. Therefore, it is possible to further improve the accuracy of adjusting the characteristic distribution of the wafer W. In addition, the hole pattern 331a of the base reflector 331 may not be line symmetric or both the hole pattern 332a of the cover reflector 332 and the hole pattern 331a of the base reflector 331 may not be line symmetric.

Eleventh Embodiment

A vapor phase growth apparatus and a vapor phase growth method according to this embodiment differ from the vapor phase growth apparatus and the vapor phase growth method according to the ninth embodiment in that the second sub-pattern does not have a hole pattern. Hereinafter, the description of the same content as that in the ninth embodiment will not be repeated.

Figure 22A:
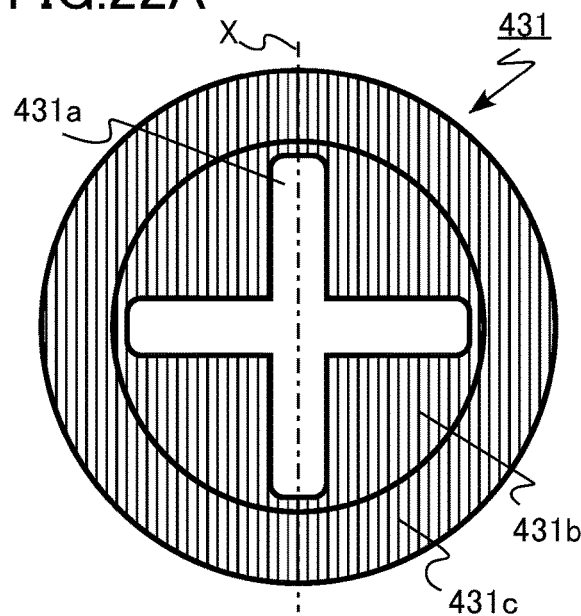
FIGS. 22A, 22B, 22C, and 22D are diagrams schematically illustrating an example of a reflector according to an eleventh embodiment.
Figure 22B:
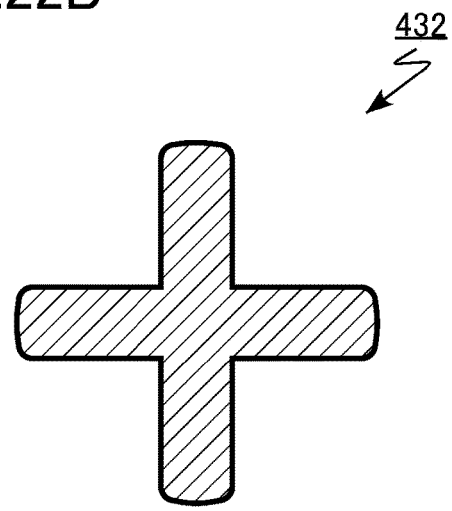
Figure 22C:
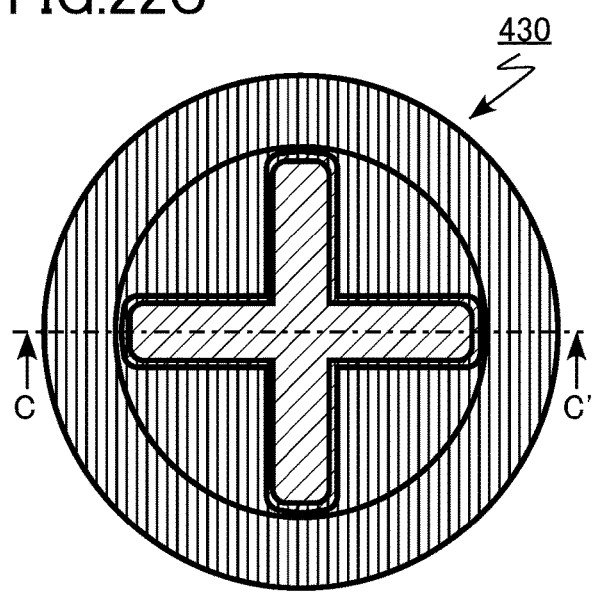
Figure 22D:
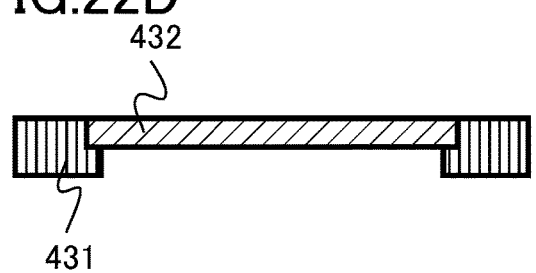

FIGS. 22A, 22B, 22C, and 22D are diagrams schematically illustrating an example of an adjustment reflector according to this embodiment. FIGS. 22A, 22B, and 22C are top views illustrating a reflector and FIG. 22D is a cross-sectional view taken along the line CC' of FIG. 22C.

An adjustment reflector 430 includes a base reflector 431 (first portion) and a cover reflector 432 (second portion).

FIG. 22A illustrates the base reflector 431 and FIG. 22B illustrates the cover reflector 432. FIGS. 22C and 22D illustrate a state in which the cover reflector 432 is superimposed on the base reflector 431.

As illustrated in FIG. 22A, the base reflector 431 has a first sub-pattern. The first sub-pattern is a hole pattern 431a. The hole pattern 431a has a symmetry axis X that passes through the center of the relative rotation between the base reflector 431 and the cover reflector 432. The hole pattern 431a is line symmetric with respect to the symmetry axis X. The center of the relative rotation between the base reflector 431 and the cover reflector 432 is aligned with the center of the base reflector 431.

In addition, the base reflector 431 includes an inner circumferential portion 431b and an outer circumferential portion 431c. The inner circumferential portion 431b has a concave shape. The hole pattern 431a is provided in the inner circumferential portion 431b.

As illustrated in FIG. 22B, the cover reflector 432 has a second sub-pattern. The second sub-pattern has a cross shape that covers the hole pattern 431a. The second sub-pattern does not have a hole pattern.

As illustrated n FIG. 22C, the cover reflector 432 is fitted to the inner circumferential portion 431b of the base reflector 431. The first sub-pattern and the second sub-pattern overlap each other and the pattern of the adjustment reflector 430 is formed.

FIGS. 23A, 23B, 23C, 23D, 23E, and 23F are diagrams illustrating a change in the pattern of the adjustment reflector according to this embodiment. FIGS. 23A, 23B, 23C, 23D, 23E, and 23F illustrate an aspect in which the cover reflector 432 is rotated with respect to the base reflector 431 by a predetermined rotation angle to change the pattern of the adjustment reflector 330.

Figure 23A:
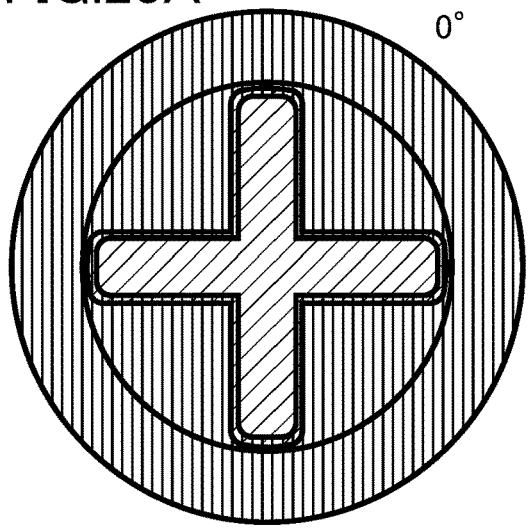
FIGS. 23A, 23B, 23C, 23D, 23E, and 23F are diagrams illustrating a change in a pattern of an adjustment reflector according to the eleventh embodiment.
Figure 23B:
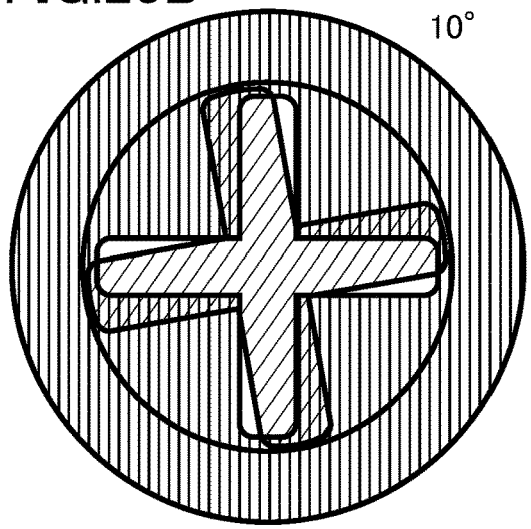
Figure 23C:
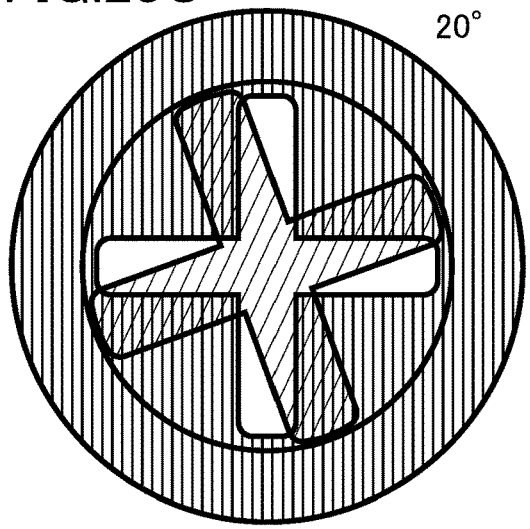
Figure 23D:
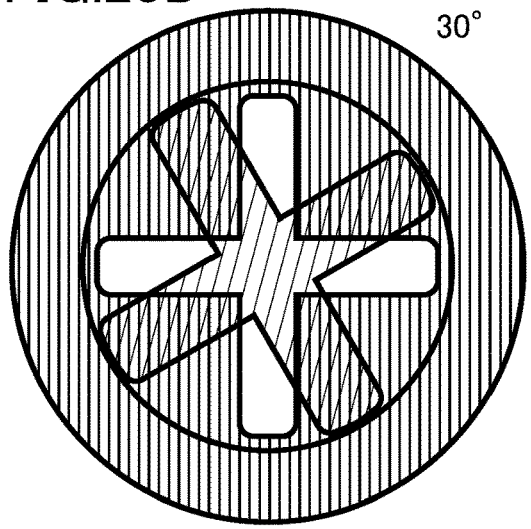
Figure 23E:
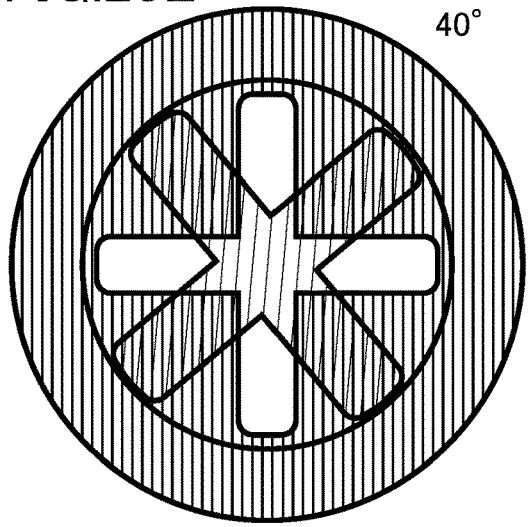
Figure 23F:
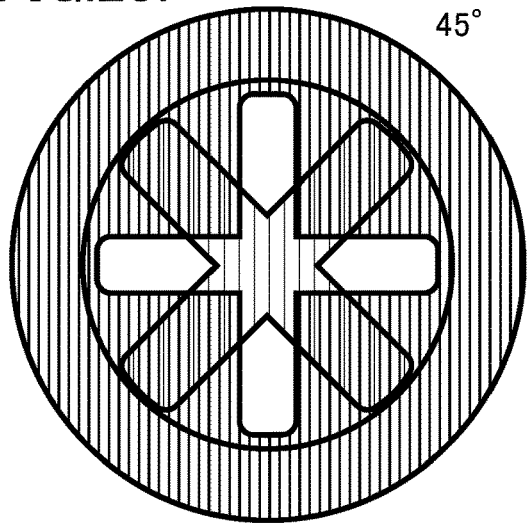

FIG. 23A illustrates a state in which the hole pattern 431a of the base reflector 431 and the cross shape of the cover reflector 432 overlap each other. It is assumed that the rotation angle of the pattern illustrated in FIG. 23A is 0 degree. For example, the pattern illustrated in FIG. 23A is referred to as a first pattern.

FIGS. 23B, 23C, 23D, 23E, and 23F illustrate patterns obtained by rotating the cover reflector 432 in a counterclockwise direction by 10 degrees, 20 degrees, 30 degrees, 40 degrees, and 45 degrees from the pattern illustrated in FIG. 23A, respectively. For example, the patterns illustrated in FIGS. 23B, 23C, 23D, 23E, and 23F are referred to as a second pattern.

The base reflector 431 and the cover reflector 432 are relatively rotated to change the pattern of the adjustment reflector 430 from the first pattern to the second pattern. The base reflector 431 and the cover reflector 432 are relatively rotated to change the degree of overlap between the first sub-pattern and the second sub-pattern. The base reflector 431 and the cover reflector 432 are relatively rotated to change the opening area of the adjustment reflector 430.

In the pattern illustrated in FIG. 23A, the adjustment reflector 430 does not have an opening portion. In the case of the pattern illustrated in FIG. 23A, the adjustment reflector 430 has the smallest opening area. The opening area of the adjustment reflector 430 sequentially increases in the order of FIG. 23B, FIG. 23C, FIG. 23D, and FIG. 23E. In the pattern illustrated in FIG. 23F, the adjustment reflector 430 has the largest opening portion.

According to the vapor phase growth apparatus and the vapor phase growth method according to this embodiment, the same effect as that in the ninth embodiment is obtained. In addition, the adjustment reflector 430 has a simple structure in which the cover reflector 432 is fitted to the inner circumferential portion 431b of the base reflector 431. Therefore, manufacturing costs are reduced.

Twelfth Embodiment

A vapor phase growth apparatus and a vapor phase growth method according to this embodiment differ from the vapor phase growth apparatus and the vapor phase growth method according to the ninth embodiment in that the second reflector includes a third portion that can be relatively rotated with respect to the first portion and the second portion. Hereinafter, the description of the same content as that in the ninth embodiment will not be repeated.

Figure 24A:
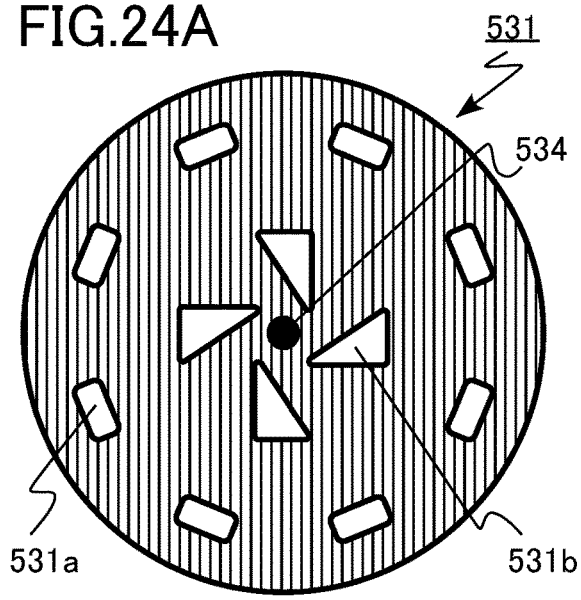
FIGS. 24A, 24B, 24C, 24D, and 24E are diagrams schematically illustrating an example of a reflector according to a twelfth embodiment.
Figure 24B:
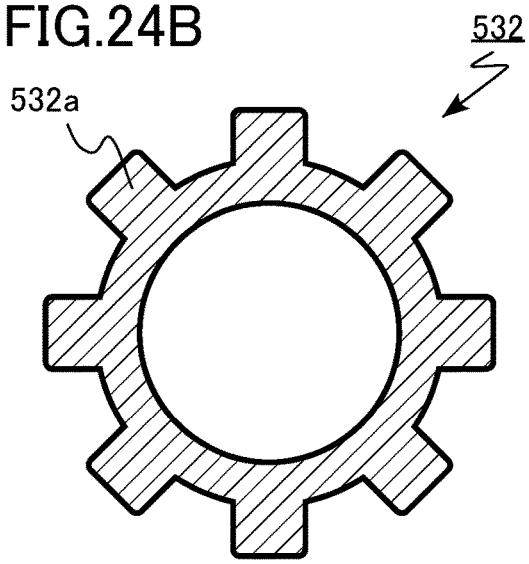
Figure 24C:
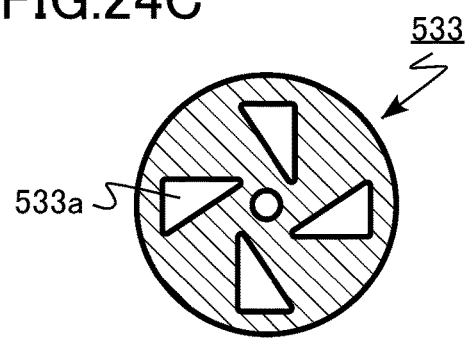
Figure 24D:
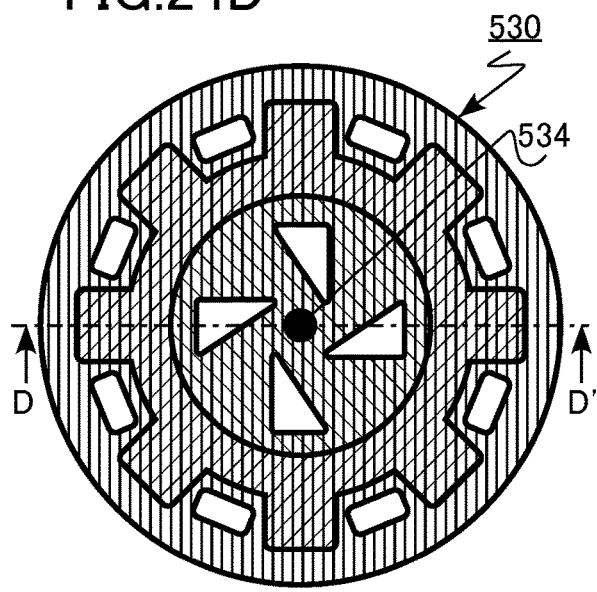
Figure 24E:
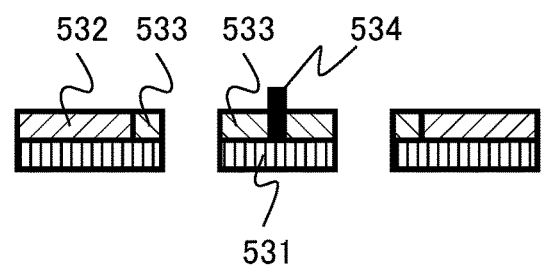

FIGS. 24A, 24B, 24C, 24D, and 24E are diagrams schematically illustrating an example of an adjustment reflector according to this embodiment. FIGS. 24A, 24B, 24C, and 24D are top views illustrating a reflector and FIG. 24E is a cross-sectional view taken along the line DD' of FIG. 24D.

An adjustment reflector 530 includes a base reflector 531 (first portion), an outer cover reflector 532 (second portion), and an inner cover reflector 533 (third portion). The adjustment reflector 530 includes a fixed shaft 534. The fixed shaft 534 is the center of the relative rotation between the base reflector 531, the outer cover reflector 532, and the inner cover reflector 533. The fixed shaft 534 passes through the inner cover reflector 533.

FIG. 24A illustrates the base reflector 531, FIG. 24B illustrates the outer cover reflector 532, and FIG. 24C illustrates the inner cover reflector 533. FIGS. 24D and 24E illustrate a state in which the outer cover reflector 532 and the inner cover reflector 533 are superimposed on the base reflector 531.

As illustrated in FIGS. 24D and 24E, the outer cover reflector 532 is fitted to the outside of the inner cover reflector 533. The outer cover reflector 532 and the inner cover reflector 533 can be independently rotated with respect to the base reflector 531.

As illustrated in FIG. 24A, the base reflector 531 has a first sub-pattern. The first sub-pattern includes eight hole patterns 531a provided in an outer circumferential portion and four hole patterns 531b provided in an inner circumferential portion. The hole patterns 531a provided in the outer circumferential portion have a symmetrical axis that passes through the center of rotation. In contrast, the hole patterns 531b provided in the inner circumferential portion does not have a symmetry axis that passes through the center of rotation.

As illustrated in FIG. 24B, the outer cover reflector 532 has a second sub-pattern. The second sub-pattern is a ring-shaped pattern that has eight protrusions 532a corresponding to the eight hole patterns 531a provided in the outer circumferential portion of the base reflector 531.

As illustrated in FIG. 24C, the inner cover reflector 533 has a third sub-pattern. The third sub-pattern includes four hole patterns 533a that correspond to the four hole patterns 531b provided in the inner circumferential portion of the base reflector 531.

As illustrated in FIG. 24D, the outer cover reflector 532 and the inner cover reflector 533 are superimposed on the base reflector 531 such that the first sub-pattern overlaps the second sub-pattern and the third sub-pattern. In this way, the pattern of the adjustment reflector 530 is formed.

FIGS. 25A, 25B, 25C, and 25D are diagrams illustrating a change in the pattern of the adjustment reflector according to this embodiment. FIGS. 25A, 25B, 25C, and 25D illustrate an aspect in which the outer cover reflector 532 and the inner cover reflector 533 are independently rotated on the fixed shaft 534 with respect to the base reflector 531 by a predetermined rotation angle to change the pattern of the adjustment reflector 530.

Figure 25A:
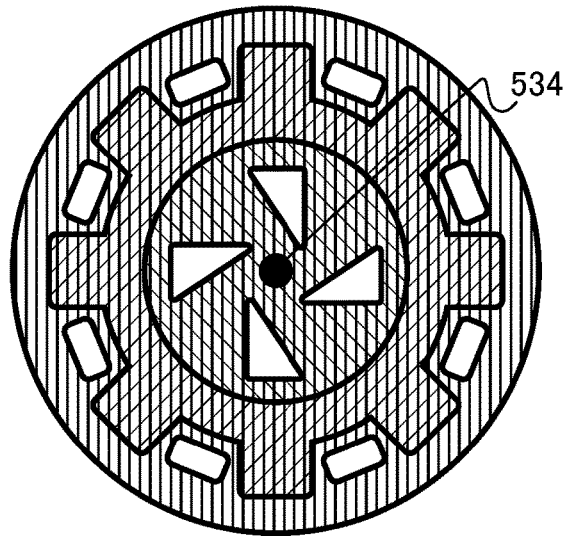
FIGS. 25A, 25B, 25C, and 25D are diagrams illustrating a change in a pattern of an adjustment reflector according to the twelfth embodiment.

FIG. 25A illustrates a state in which the eight hole patterns 531a provided in the outer circumferential portion of the base reflector 531 do not overlap the eight protrusions 532a of the outer cover reflector 532 and the four hole patterns 531b provided in the inner circumferential portion of the base reflector 531 overlap the four hole patterns 533a of the inner cover reflector 533. It is assumed that the rotation angle of the inner cover reflector 533 in the pattern illustrated in FIG. 25A is 0 degree. In addition, it is assumed that the rotation angle of the outer cover reflector 532 in the pattern illustrated in FIG. 25A is 0 degree. For example, the pattern illustrated in FIG. 25A is referred to as a first pattern.

Figure 25B:
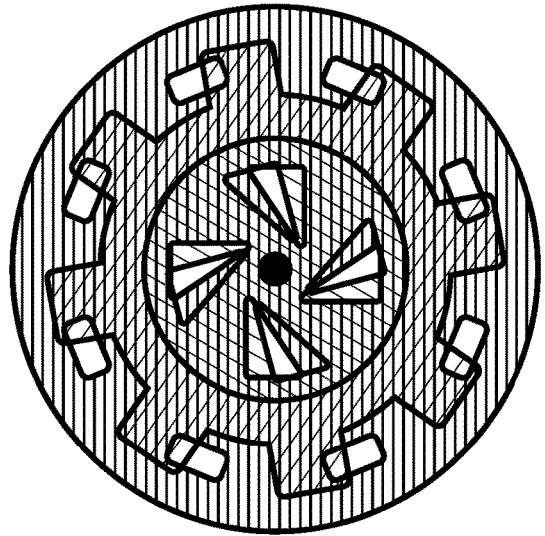
Figure 25C:
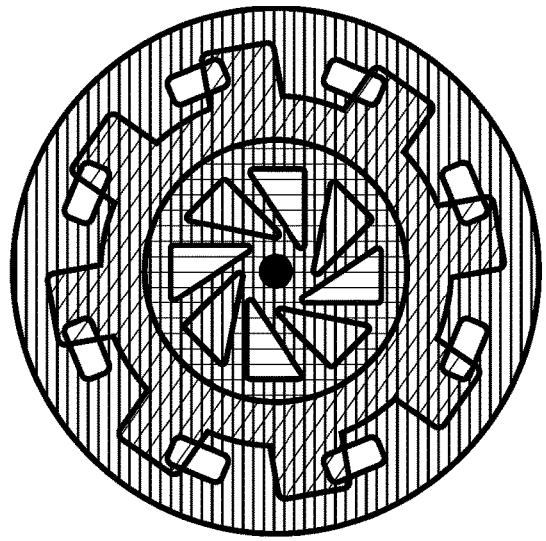
Figure 25D:
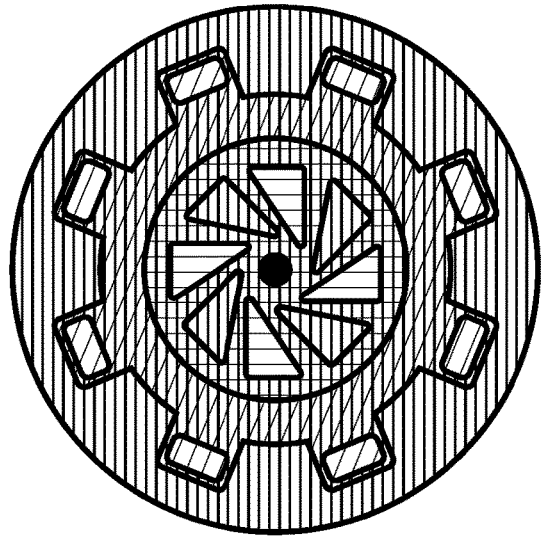

FIGS. 25B, 25C, and 25D illustrate patterns obtained by independently rotating the inner cover reflector 533 and the outer cover reflector 532 in a counterclockwise direction from the pattern illustrated in FIG. 25A. In FIG. 25B, the rotation angle of the inner cover reflector 533 is 15 degrees and the rotation angle of the outer cover reflector 532 is 10 degrees. In FIG. 25C, the rotation angle of the inner cover reflector 533 is 45 degrees and the rotation angle of the outer cover reflector 532 is 10 degrees. In FIG. 25D, the rotation angle of the inner cover reflector 533 is 45 degrees and the rotation angle of the outer cover reflector 532 is 22.5 degrees. For example, the patterns illustrated in FIGS. 25B, 25C, and 25D are referred to as a second pattern.

The base reflector 531, the inner cover reflector 533, and the outer cover reflector 532 are independently rotated relative to each other to change the pattern of the adjustment reflector 530 from the first pattern to the second pattern. The base reflector 531, the inner cover reflector 533, and the outer cover reflector 532 are relatively rotated to change the degree of overlap between the first sub-pattern, the second sub-pattern, and the third sub-pattern. The base reflector 531, the inner cover reflector 533, and the outer cover reflector 532 are relatively rotated to change the opening area of the adjustment reflector 530.

In the case of the pattern illustrated in FIG. 25A, the adjustment reflector 530 has the largest opening area. In the pattern illustrated in FIG. 25D, the adjustment reflector 530 does not have an opening portion and has the smallest opening area.

According to the vapor phase growth apparatus and the vapor phase growth method of this embodiment, the same effect as that in the ninth embodiment is obtained. In addition, since two cover reflectors that are independently rotated, that is, the inner cover reflector 533 and the outer cover reflector 532 are provided, it is possible to achieve a complicated pattern change. Therefore, it is possible to further improve the accuracy of adjusting the characteristic distribution of the wafer W.

EXAMPLES

Next, examples of the invention will be described.

Example 1

The temperature distribution of a wafer was adjusted using the vapor phase growth apparatus and the vapor phase growth method according to the first embodiment.

Figure 12:
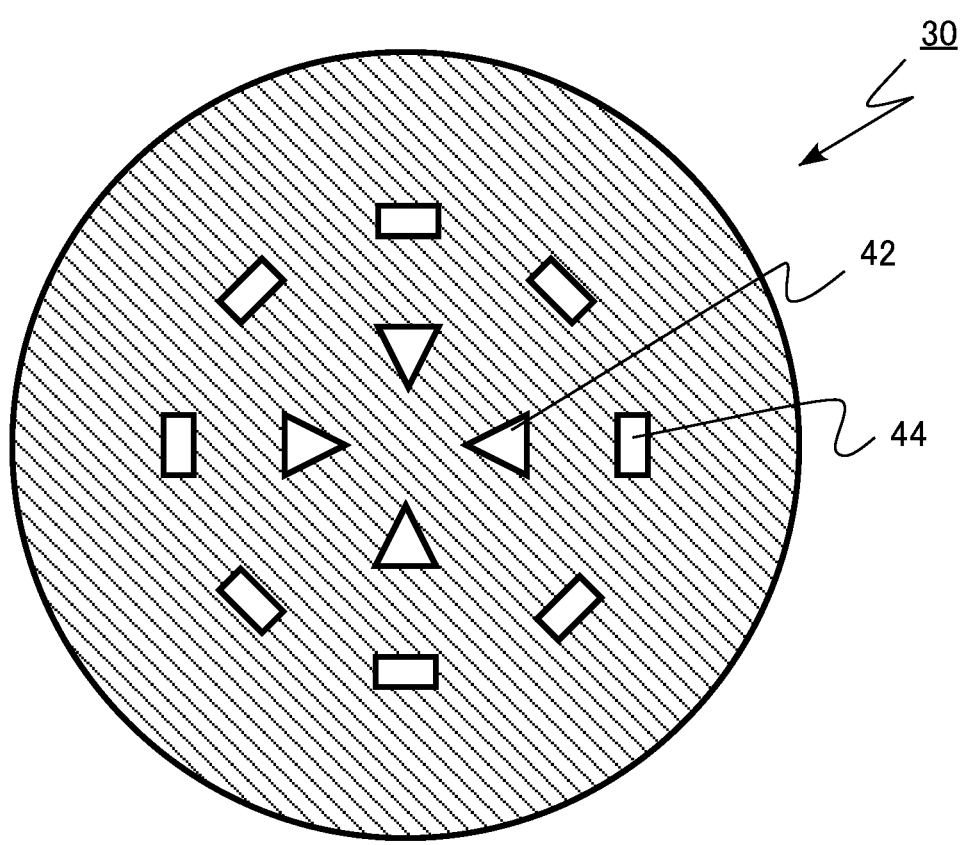
FIG. 12 is a plan view schematically illustrating a reflector according to Example 1.

FIG. 12 is a plan view schematically illustrating a reflector according to Example 1. FIG. 12 illustrates an adjustment reflector 30.

In Example 1, a disk-shape reflector is used as a standard reflector 28. In addition, the reflector having the pattern illustrated in FIG. 12 is used as the adjustment reflector 30.

Comparative Example 1

The temperature distribution of a wafer was measured by the same method as that in Example 1 except that the adjustment reflector 30 was not used and only the standard reflector 28 is used as a reflector.

Figure 13:
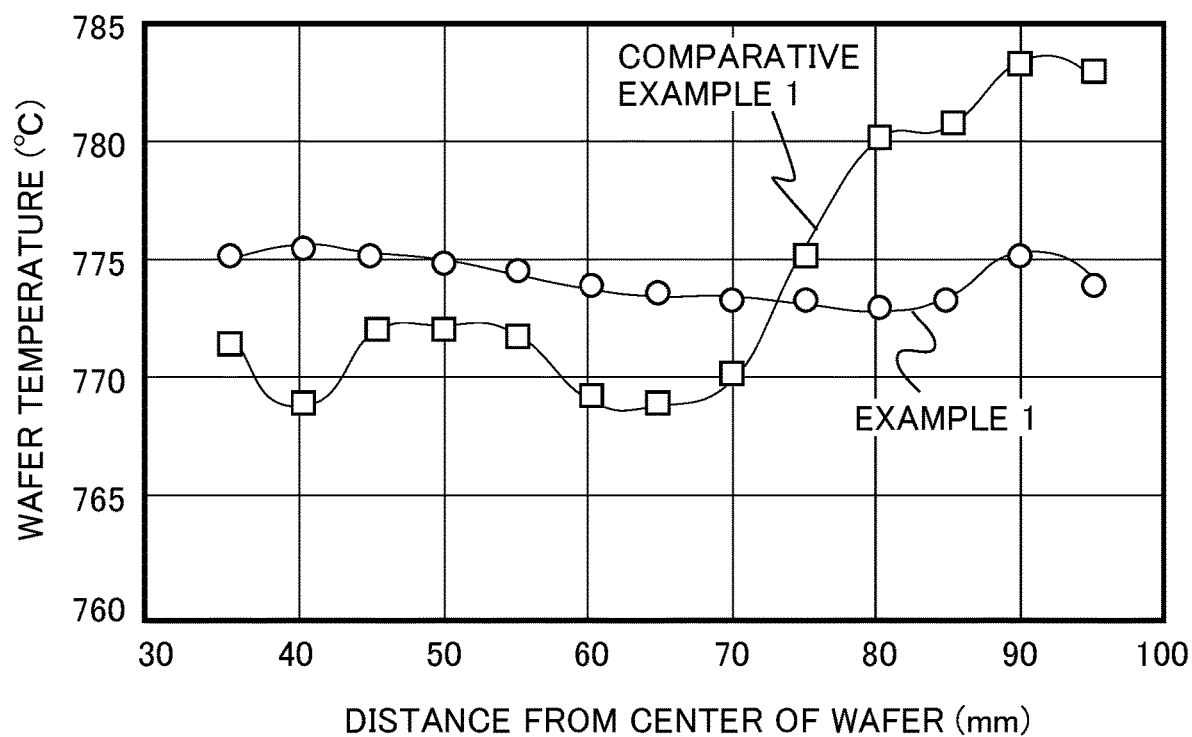
FIG. 13 is a diagram illustrating the temperature distributions of wafers according to Example 1 and Comparative Example 1.

FIG. 13 is a diagram illustrating the temperature distributions of the wafers according to Example 1 and Comparative Example 1. FIG. 13 is a diagram illustrating the influence of the adjustment reflector 30 on the temperature distribution of the wafer. The horizontal axis indicates a distance from the center of the wafer and the vertical axis indicates the temperature of the wafer.

As can be seen from FIG. 13, the uniformity of the temperature of the wafer is improved by the use of the adjustment reflector 30.

Example 2

The temperature distribution of a wafer and the film characteristics of the wafer were adjusted using the vapor phase growth method according to the second embodiment.

Figure 14A:
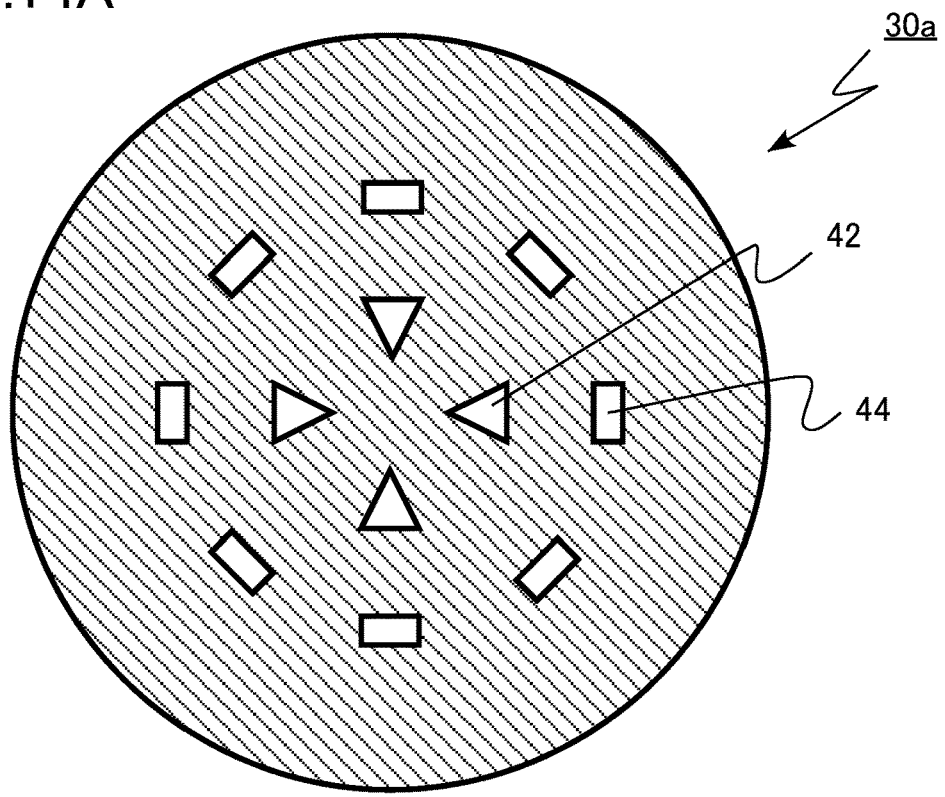
FIGS. 14A and 14B are plan views schematically illustrating a reflector according to Example 2.
Figure 14B:
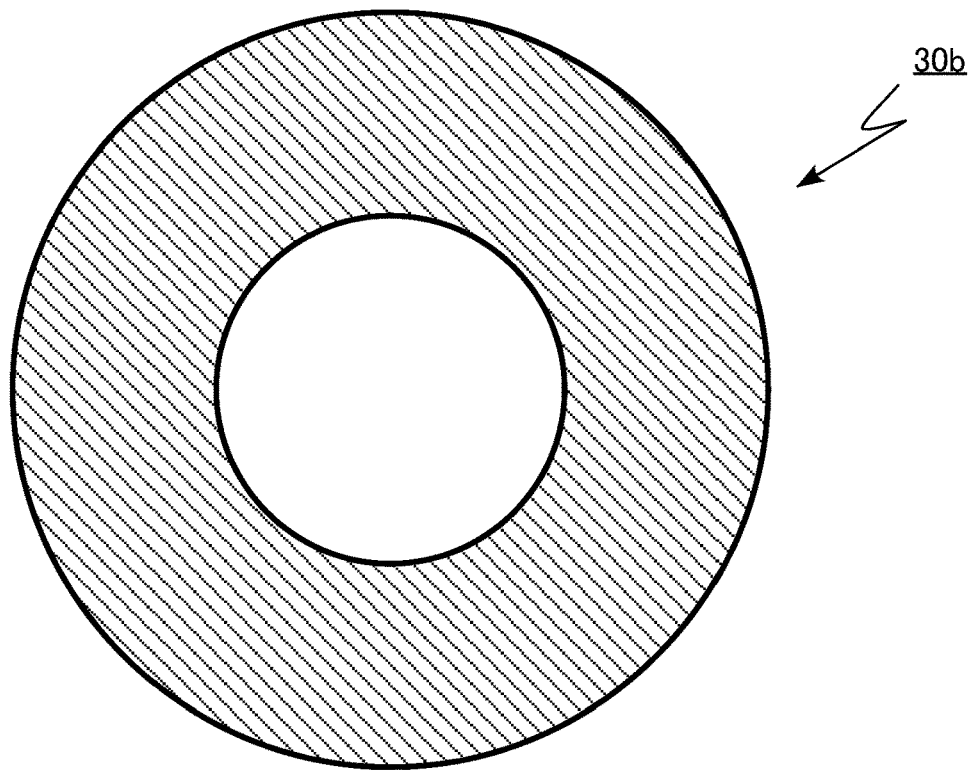
Figure 15:
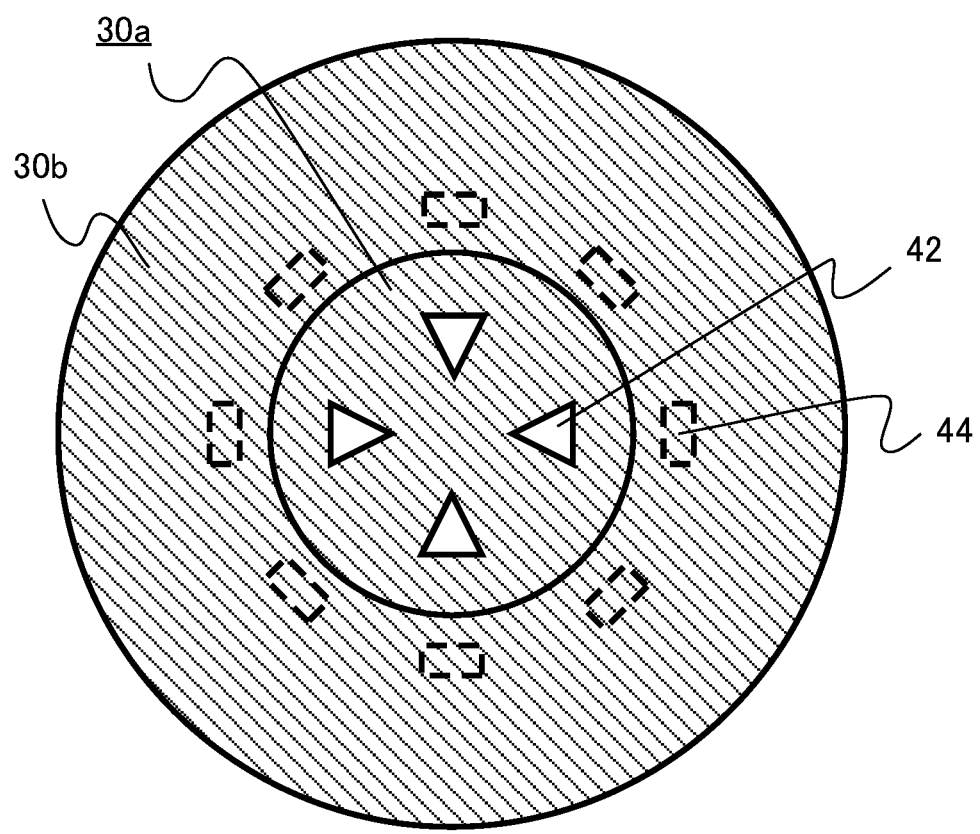
FIG. 15 is a plan view schematically illustrating the reflector according to Example 2.

FIGS. 14A and 14B and FIG. 15 are plan views schematically illustrating a reflector according to Example 2. FIGS. 14A and 14B and FIG. 15 illustrate an adjustment reflector 30.

FIG. 14A illustrates a first adjustment reflector 30a and FIG. 14B illustrates a second adjustment reflector 30b. FIG. 15 illustrates a state in which the second adjustment reflector 30b is superimposed on the first adjustment reflector 30a.

A disk-shape reflector was used as a standard reflector 28. In addition, a reflector in which the first adjustment reflector 30a and the second adjustment reflector 30b illustrated in FIG. 15 overlap each other was used as the adjustment reflector 30.

The PL of an MQW layer formed on the wafer was measured and an emission wavelength distribution was measured.

Example 3

An emission wavelength distribution was measured by the same method as that in Example 2 except that the size of an inner-circumferential-side opening portion 42 of a first adjustment reflector 30a was reduced.

Comparative Example 2

Comparative Example 2 relates to a test wafer. An MQW layer was formed under the same process conditions as those in Example 2 and Example 3 before the formation of a film on the wafer according to Example 2 or Example 3. As a reflector, only the standard reflector 28 was used. The PL of the formed MQW layer was measured and an emission wavelength distribution was measured.

Figure 16:
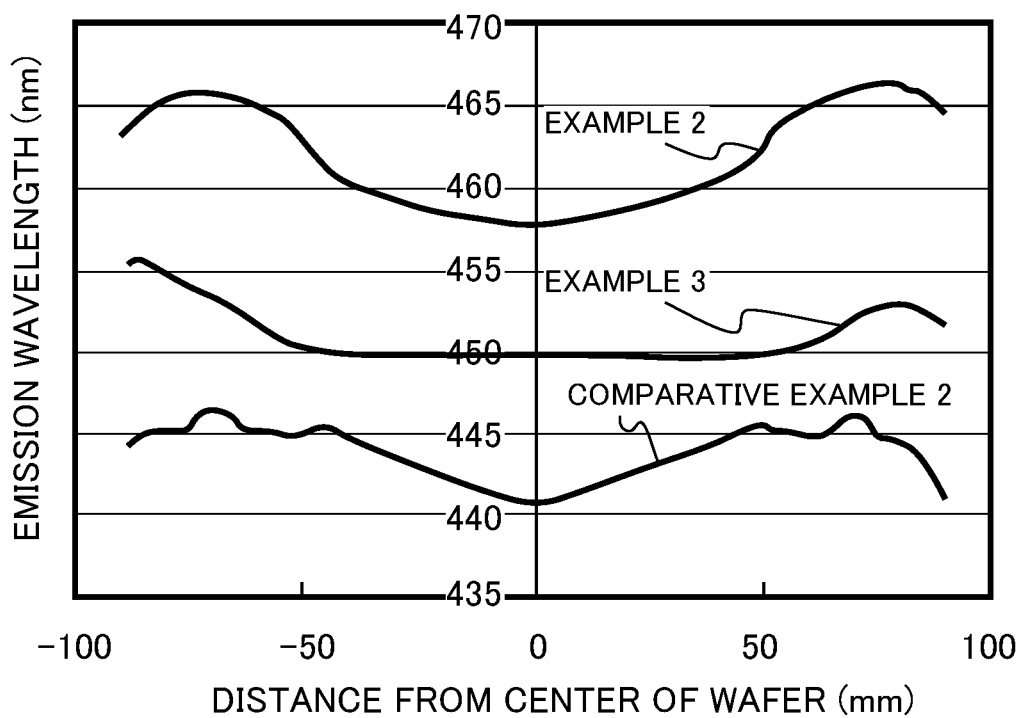
FIG. 16 is a diagram illustrating the emission wavelength distributions of MQW layers according to Example 2, Example 3, and Comparative Example 2.

FIG. 16 is a diagram illustrating the emission wavelength distributions of the MQW layers in Example 2, Example 3, and Comparative Example 2. The horizontal axis indicates a distance from the center of the wafer and the vertical axis indicates an emission wavelength.

The object of Examples 2 and 3 is to further uniformize the PL wavelength distribution of the MQW layer formed without the adjustment reflectors 30a and 30b according to Comparative Example 2. In particular, the object is to improve the uniformity of the wavelength in a radius range less than 50 mm.

As illustrated in FIG. 16, in Example 2 using the adjustment reflectors 30a and 30b, the wavelength distribution in the PL measurement in the radius range less than radius 50 mm is more improved than that in Comparative Example 2. In addition, in growth according to Example 3 in which the shape of the adjustment reflector 30a is adjusted, a very uniform wavelength distribution is obtained.

Similarly, the pattern of the adjustment reflectors 30a and 30b can be adjusted to improve the uniformity of the wavelength in the PL measurement of the MQW layer in a portion with a radius greater than 50 mm. In addition, the ratio of the power of an in-heater to the power of an out-heater may be adjusted. However, the temperature of a portion with a radius that is equal to or less than 50 mm is mainly determined by a heating operation of the in-heater. Therefore, in this case, the use of the ratio of the power of the in-heater to the power of the out-heater for the adjustment of the temperature distribution is not expected to have a considerable effect. For this reason, it is important that the adjustment reflectors 30a and 30b are adjusted to finely adjust the temperature of a portion with a small radius.

The embodiments and the examples of the invention have been described above with reference to specific examples. The above-described embodiments and examples are illustrative and do not limit the invention. In addition, the components according to each embodiment may be appropriately combined with each other.

For example, in the above-described embodiments and examples, the adjustment reflector (second reflector) 30 has a disk shaped with an opening portion and the adjustment reflector has a plurality of disks. However, the adjustment reflector 30 is not limited to the above-mentioned shapes. The adjustment reflector 30 may have any shape as long as it has a pattern. The adjustment reflector 30 may be, for example, a star-shaped plate, a polygonal plate, or a plurality of rectangular plates.

In the above-mentioned example, one standard reflector 28 is provided. However, two or more standard reflectors 28 may be provided.

For example, in the above-described embodiments, a stacked film of a plurality of InGaN films and a plurality of GaN films is epitaxially grown on a GaN film. However, for example, the invention can be applied to form other group III-V nitride-based semiconductor single-crystal films, such as an aluminum nitride (AlN) film and an aluminum gallium nitride (AlGaN) film. In addition, the invention can be applied to a group III-V semiconductor such as GaAs. Furthermore, the invention can be applied to form other films.

A case in which the process gas is mixed in the shower plate has been described as an example. However, the process gas may be mixed before it flows into the shower plate. In addition, the process gas may be in a separated state until it is ejected from the shower plate into the reaction chamber.

The ring-shaped holder 14 has been described as an example of the wafer holder. However, the wafer holder may be a dish-shaped susceptor without an opening portion at the center.

A case in which two types of heaters, that is, the in-heater 24 and the out-heater 26 are provided as the heater has been described as an example. However, only one type of heater or more than 2 types of heaters may be provided.

In the above-mentioned example, the temperature of a portion of the substrate corresponding to the opening portion of the adjustment reflector is less than that of the other portions. However, a change in the temperature of the substrate may have an opposite effect, depending on the reflectance of the reflector. In this case, an opening portion may be provided at a position of the adjustment reflector which corresponds to a portion of the substrate of which the temperature is desired to be higher than that of other portions.

In the above-described embodiments, for example, portions which are not directly necessary to describe the invention, such as the structure of the apparatus or a manufacturing method, are not described. However, the necessary structure of the apparatus or a necessary manufacturing method can be appropriately selected and used. In addition, all of the vapor phase growth apparatuses and the vapor phase growth methods which include the components according to the invention and whose design can be appropriately changed by those skilled in the art are included in the scope of the invention. The scope of the invention is defined by the scope of the claims and the scope of equivalents thereof.

What is claimed is:

1. A vapor phase growth method comprising:
   heating a first substrate using a heater and a reflector with a first pattern, the heater being interposed between the reflector and the first substrate;
   measuring a characteristic distribution of the first substrate under a predetermined process condition, the predetermined process condition being a temperature condition of growing a semiconductor film on a second substrate;
   changing the reflector from the first pattern to a second pattern different from the first pattern on a basis of the characteristic distribution of the first substrate; and
   forming the semiconductor film on the second substrate under the predetermined process condition, using the heater and the reflector changed to the second pattern,
   wherein the reflector includes a first reflector and a second reflector,
   the first reflector has a first sub-pattern and the second reflector has a second sub-pattern,
   the first reflector and the second reflector are configured to rotate relatively in circumferential direction to change a pattern of the reflector from the first pattern to the second pattern,
   the first sub-pattern includes first hole patterns, the first hole patterns have a symmetry axis that passes through a center of rotation, the first hole patterns are line symmetric with respect to the symmetry axis, and
   the second sub-pattern includes second hole patterns, the second hole patterns do not have a symmetry axis that passes through the center of rotation, the first hole patterns and the second hole patterns are configured to overlap at a certain rotation angle.

2. The vapor phase growth method according to claim 1, wherein the characteristic distribution is a temperature distribution.

* * * * *